(12) United States Patent
Shimizu et al.

(10) Patent No.: US 9,040,832 B2
(45) Date of Patent: May 26, 2015

(54) WIRING SUBSTRATE AND METHOD OF MANUFACTURING THE SAME

(75) Inventors: Yuichiro Shimizu, Nagano (JP); Ryo Fukasawa, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 401 days.

(21) Appl. No.: 13/433,680

(22) Filed: Mar. 29, 2012

(65) Prior Publication Data
US 2012/0247814 A1    Oct. 4, 2012

(30) Foreign Application Priority Data

Mar. 29, 2011 (JP) ................................ 2011-072694
Jan. 27, 2012 (JP) ................................ 2012-015679

(51) Int. Cl.
| | |
|---|---|
| H01L 23/498 | (2006.01) |
| H05K 3/38 | (2006.01) |
| H05K 1/09 | (2006.01) |
| H05K 3/46 | (2006.01) |
| H01L 21/48 | (2006.01) |
| H05K 3/10 | (2006.01) |

(52) U.S. Cl.
CPC .......... H01L 23/49822 (2013.01); H05K 3/388 (2013.01); H05K 3/386 (2013.01); H05K 1/09 (2013.01); H05K 3/108 (2013.01); H05K 3/389 (2013.01); H05K 3/4644 (2013.01); H05K 2203/0338 (2013.01); H01L 21/4857 (2013.01); H01L 2224/16225 (2013.01); H01L 2224/32225 (2013.01); H01L 2224/73204 (2013.01); H01L 2924/15311 (2013.01)

(58) Field of Classification Search
CPC .......... H05K 3/386; H05K 3/388; H05K 1/09
USPC ........................................................ 174/257
See application file for complete search history.

(56) References Cited

U.S. PATENT DOCUMENTS

2002/0162687 A1    11/2002  Akihiko
2011/0162876 A1 *  7/2011   Arvin et al. ................... 174/257

FOREIGN PATENT DOCUMENTS

JP        2002-252459 A1    9/2002

* cited by examiner

Primary Examiner — Jeremy C Norris
(74) Attorney, Agent, or Firm — Kratz, Quintos & Hanson, LLP

(57) ABSTRACT

A method of manufacturing a wiring substrate, includes obtaining a laminated body in which a first copper tin alloy layer and a copper layer are arranged in sequence on a first coupling agent layer, on a first insulating resin layer, forming a seed layer on the copper layer, forming a plating resist in which an opening portion is provided on the seed layer, forming a metal plating layer in the opening portion of the plating resist by applying an electroplating that utilizes the seed layer as a plating power feeding path, removing the plating resist, and forming a first wiring layer on the first coupling agent layer by etching the seed layer, the copper layer, and the first copper tin alloy layer while using the metal plating layer as a mask.

4 Claims, 23 Drawing Sheets in the case of including the
extended wiring port
(fragmental enlarged plan view (1))

in the case of including the island-
like pad part
(fragmental enlarged plan view (2))

FIG. 14

| | metal layer | coupling agent layer | surface roughness [nm] | | peel strength [kgf/cm] | | |
|---|---|---|---|---|---|---|---|
| | | | Ra | Rz | initial stage | after HAST | after reflow test |
| embodiment sample | copper layer / tin layer | existence | 16.5 | 124 | 0.99 | 1.01 | 1.00 |
| embodiment sample 1 | copper layer | non existence | 21.5 | 126 | 0.70 | 0.49 | 0.24 |
| embodiment sample 2 | copper layer / tin layer | non existence | 15.8 | 105 | 0.75 | 0.48 | 0.61 |
| embodiment sample 3 | copper layer (electroless plating) | non existence | 215 | 1430 | 0.83 | 0.68 | 0.73 |

US 9,040,832 B2

WIRING SUBSTRATE AND METHOD OF MANUFACTURING THE SAME

CROSS-REFERENCE TO RELATED APPLICATIONS

This application is based upon and claims the benefit of priority of the prior Japanese Patent Application No. 2011-072694 filed on Mar. 29, 2011, and No. 2012-015679 filed on Jan. 27, 2012, the entire contents of which are incorporated herein by reference.

FIELD

It is related to a wiring substrate on which an electronic component such as a semiconductor chip, or the like is mounted, and a method of manufacturing the same.

BACKGROUND

In the prior art, there is the wiring substrate on which an electronic component such as a semiconductor chip, or the like is mounted. In an example of such wiring substrate, the build-up wiring is formed on one surface or both surfaces of the core substrate by the semi-additive process, or the like.

In recent years, with the enhancement in performances of an electronic component such as a semiconductor chip, or the like, a narrower pitch of the wiring layers in the wiring substrate is being advanced.

A related art is disclosed in Japanese Laid-open Patent Publication No. 2002-252459.

As explained in the column of the preliminary matter described later, in the case that the multilayer wiring is formed by using the semi-additive process, when the desmear process is applied to the inside of the via holes, a surface of the insulating resin layer is also etched and roughened simultaneously. Accordingly, the wiring layers can be formed on the insulating resin layer with good adhesion by the anchor effect.

In recent years, with the progress of size reduction and higher performance of the semiconductor chip, the further miniaturization of the wiring layers of the wiring substrate is requested.

In such a situation that unevenness is produced on a surface of the insulating resin layer, particularly when a narrower pitch of the wiring layers is advanced, the residue is ready to occur upon etching the seed layer. Therefore, an electric short-circuit is easily caused between the wiring layers. Further, such a problem exists that a transmission loss of the high-frequency signal is ready to occur, in the wiring layers which are formed on the unevenness of the insulating resin layer.

In this manner, in the method of ensuring adhesion of the wiring layers by roughening the surface of the insulating resin layer, particularly, it is difficult to form the fine wiring layers whose line width is 10 μm or less with good reliability. As a result, the technology to form the fine wiring layers on a smooth resin layer with good adhesion is demanded.

SUMMARY

According to one aspect discussed herein, there is provided a method of manufacturing a wiring substrate, which includes obtaining a laminated body, in which a first copper tin alloy layer and a copper layer are arranged in sequence on a first coupling agent layer, on a first insulating resin layer; forming a seed layer on the copper layer, forming a plating resist, in which an opening portion is provided, on the seed layer; forming a metal plating layer in the opening portion of the plating resist by applying an electroplating that utilizes the seed layer as a plating power feeding path, removing the plating resist; and forming a first wiring layer on the first coupling agent layer, by etching the seed layer, the copper layer, and the first copper tin alloy layer while using the metal plating layer as a mask.

Also, according to another aspect discussed herein, there is provided a wiring substrate, which includes a first insulating resin layer, a first coupling agent layer formed on the first insulating resin layer, and a first wiring layer including a first copper tin alloy layer formed on the first coupling agent layer, a copper layer formed on the first copper tin alloy layer, a seed layer formed on the copper layer, and a metal plating layer formed on the seed layer.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 14 is a table depicting peel strength of respective metal layers in the embodiment sample (FIG. 13D) and comparative samples;

DESCRIPTION OF EMBODIMENTS

Embodiments of the present invention will be explained with reference to the accompanying drawings hereinafter.

Prior to the explanation of embodiments, the preliminary matter to be set forth as a basis will be explained hereunder. FIGS. 1A to 1C and FIGS. 2A to 2C are sectional views to explain the preliminary matter.

Figure 1A:
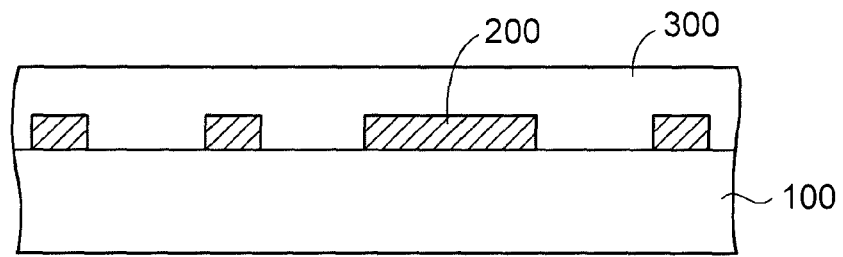
FIGS. 1A to 1C are sectional views (#1) to explain the preliminary matter.

As depicted in FIG. 1A, first, a first wiring layer 200 made of copper is formed on a core substrate 100. Then, an insulating resin layer 300 covering the first wiring layer 200 is formed on the core substrate 100.

Figure 1B:
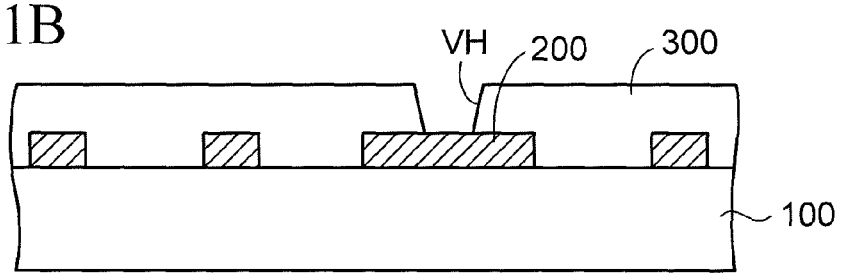

Then, as depicted in FIG. 1B, the insulating resin layer 300 is processed by the laser. Thus, a via hole VH reaching a connection part of the first wiring layer 200 is formed.

Figure 1C:
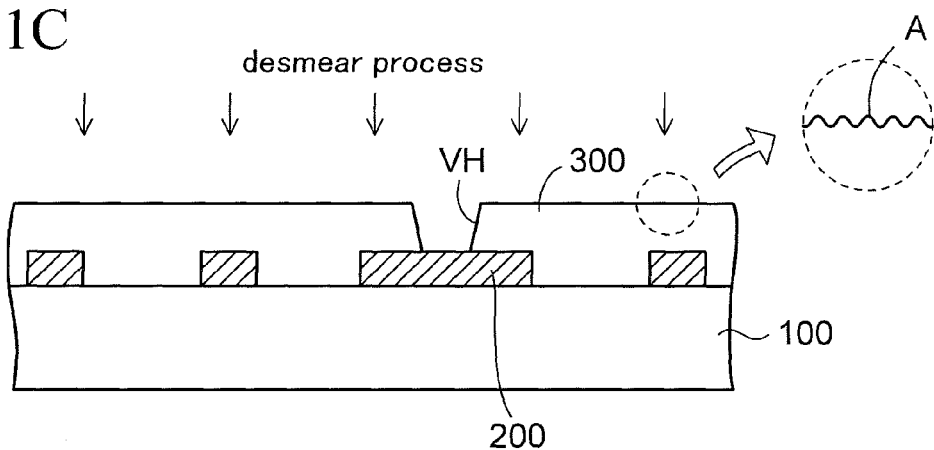

Then, as depicted in FIG. 1C, the desmear process is applied to the inside of the via hole VH by using the permanganate process, or the like. By this matter, the resin smears remained in the inside of the via hole VH, etc. can be removed, and thus the inside of the via hole VH can be cleaned. A surface of the insulating resin layer 300 is etched simultaneously by the desmear process to constitute a roughened surface A. A surface roughness (Ra) of the roughened surface A of the insulating resin layer 300 is 300 nm or more.

Figure 2A:
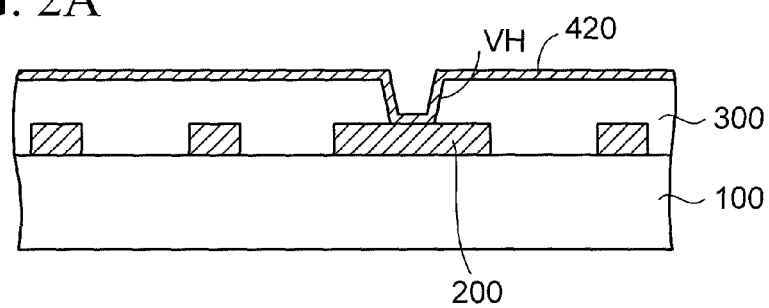
FIGS. 2A to 2C are sectional views (#2) to explain the preliminary matter.
Figure 2B:
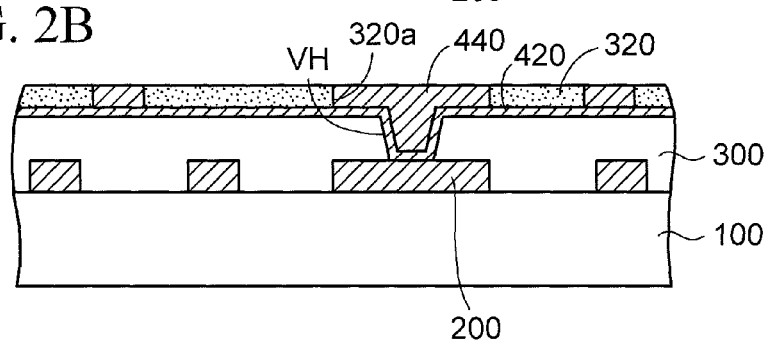

Then, as depicted in FIG. 2A, a seed layer 420 made of copper is formed on the insulating resin layer 300 and the inner surface of the via hole VH by the electroless plating. Then, as depicted in FIG. 2B, a plating resist 320 in which an opening portion 320a is provided in the part in which the second wiring layer is arranged is formed on the seed layer 420.

Then, a metal plating layer 440 made of copper is formed in the opening portion 320a of the plating resist 320 by the electric plating utilizing the seed layer 420 as a plating power feeding path.

Figure 2C:
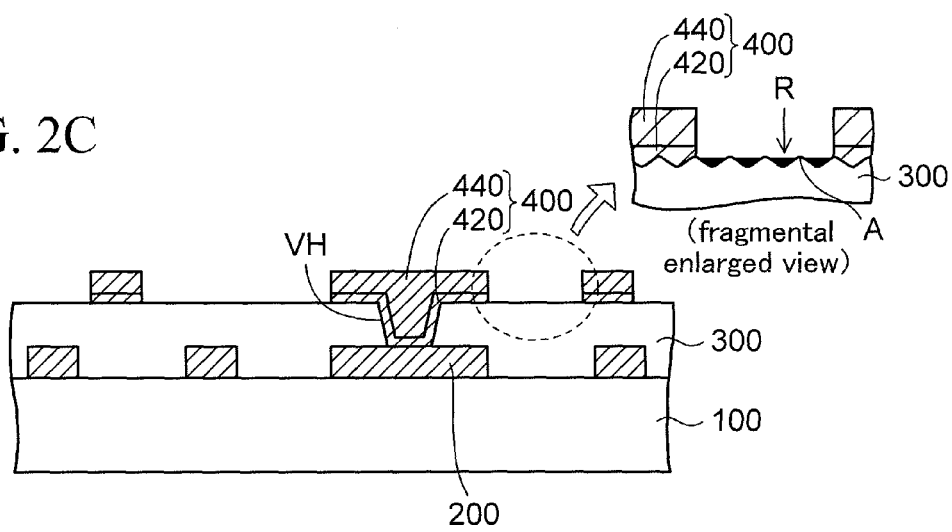

Then, as depicted in FIG. 2C, the plating resist 320 is removed. Then, the seed layer 420 is etched by using the metal plating layer 440 as a mask. By this matter, a second wiring layer 400 formed of the seed layer 420 and the metal plating layer 440 can be obtained on the insulating resin layer 300. The second wiring layer 400 is connected electrically to the connection part of the first wiring layer 200 via the via hole VH (via conductor).

At this time, as depicted in a fragmental enlarged view of FIG. 2C, the surface of the insulating resin layer 300 constitutes the roughened surface A, and the relatively large unevenness is produced. Therefore, an etching residue R is easily produced on the roughened surface A at the time when the seed layer 420 is to be etched, and also an electric short-circuit between the wirings is easily brought about.

Also, when an extent of over-etching is increased in order to remove completely the etching residue R of the seed layer 420, particularly in the case that the fine patterns whose line width is 10 μm or less is employed, the pattern jump may be caused due to the side etching, and some of patterns may disappear in some cases.

Further, the second wiring layer 400 is formed on the roughened surface A (unevenness) of the insulating resin layer 300. Therefore, a transmission loss of the high-frequency signal is easily generated on account of the influence of the unevenness. As a result, it is difficult to serve as the wiring substrate for mounting a high-performance semiconductor chip thereon.

According to embodiments explained hereunder, the disadvantages mentioned above can be solved.

First Embodiment

Figure 9A:
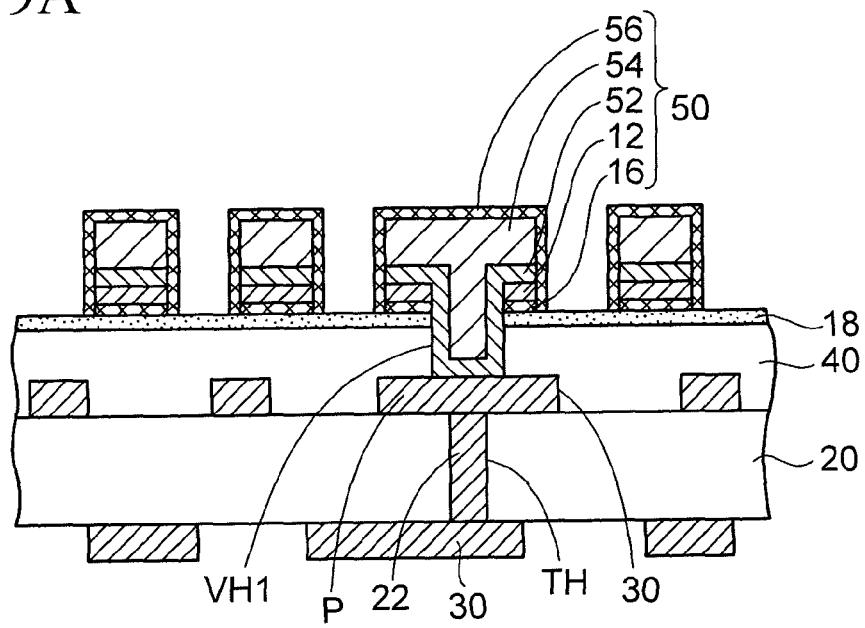
FIGS. 9A and 9B are sectional views (#6) depicting the method of manufacturing the wiring substrate according to the first embodiment.
Figure 9B:
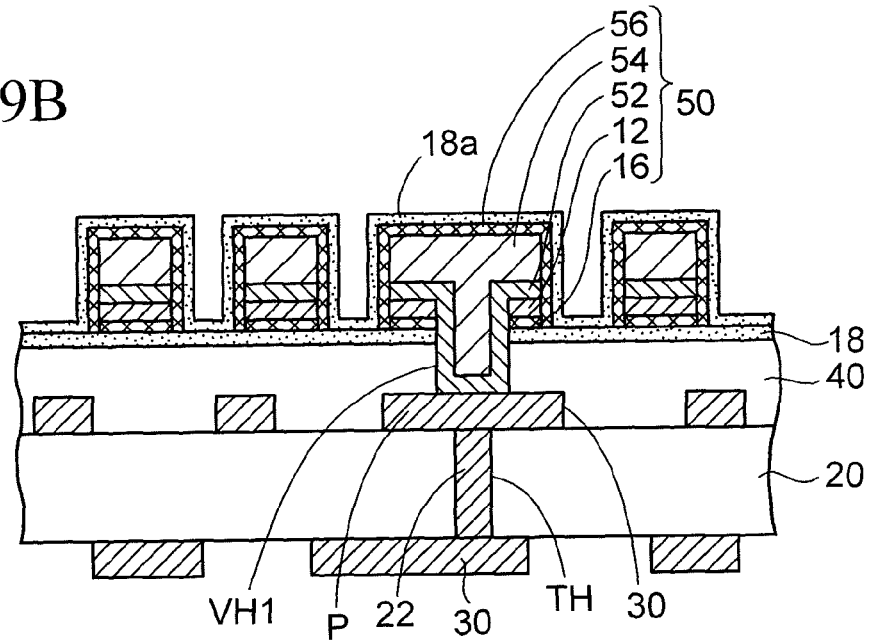
Figure 10A:
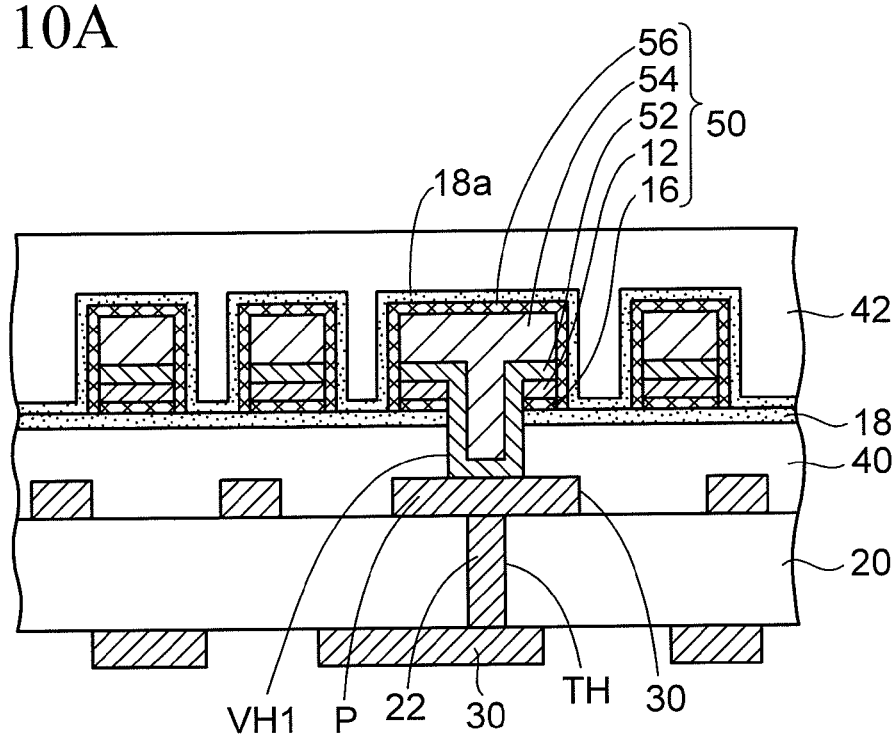
FIGS. 10A and 10B are sectional views (#7) depicting the method of manufacturing the wiring substrate according to the first embodiment.
Figure 10B:
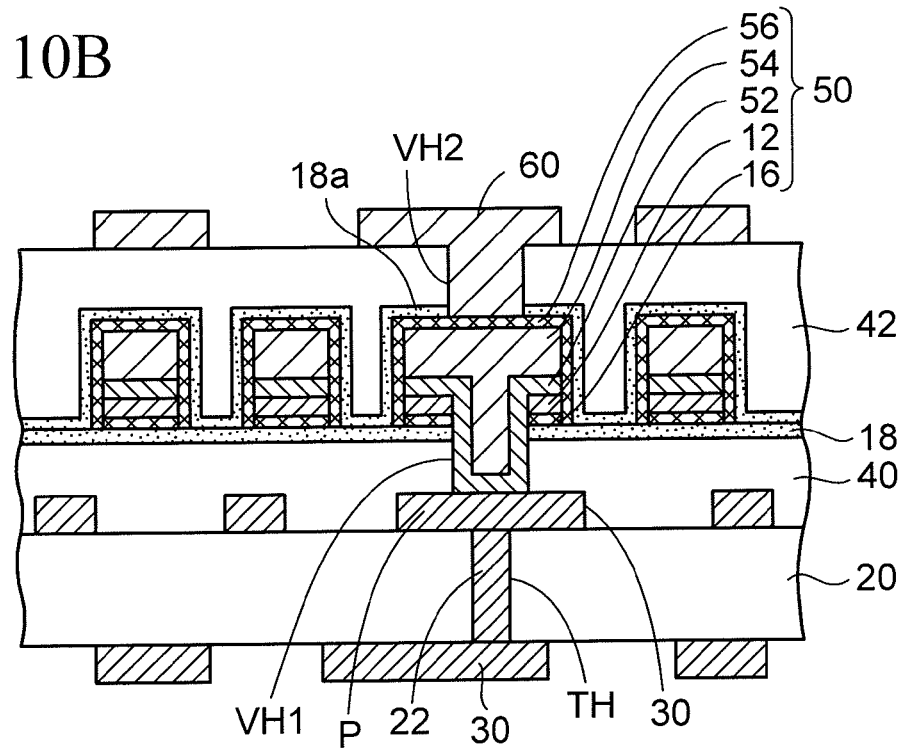
Figure 11:
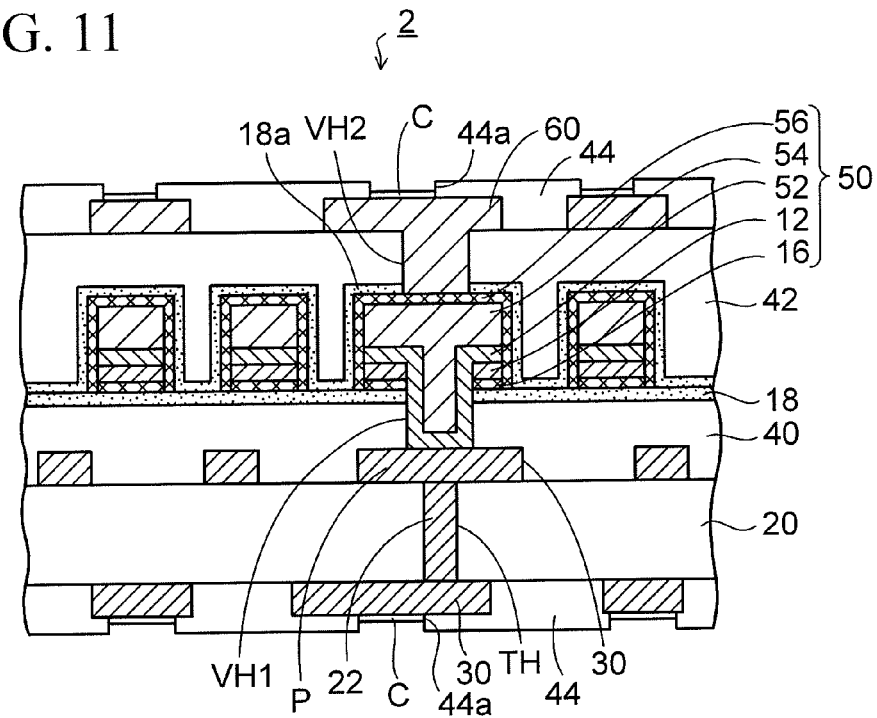
FIG. 11 is a sectional view depicting a wiring substrate according to the first embodiment.

FIGS. 3A to 3E are sectional views depicting a method of manufacturing a metal layer transfer base material used in a first embodiment, FIG. 4A to FIG. 10B are sectional views depicting a method of manufacturing a wiring substrate according to the first embodiment, and FIG. 11 is a sectional view depicting a wiring substrate according to the first embodiment.

At first, a method of manufacturing a metal layer transfer base material used in the method of manufacturing the wiring substrate according to the first embodiment will be explained hereunder.

Figure 3A:
FIGS. 3A to 3E are sectional views depicting a method of manufacturing a metal layer transfer base material used in a first embodiment.

As depicted in FIG. 3A, first, a supporting body 10 is prepared. As the supporting body 10, PET (poly ethylene terephthalate) film, PEN (poly ethylene naphthalate) film, LCP resin (liquid crystal polymer) film, glass substrate, SUS (stainless) substrate, or the like is used. In the case that the PET film is used, its thickness is set in the range from 10 μm to 200 μm.

As the material of the supporting body 10, any material out of organic material, inorganic material, and metal material may be used.

The supporting body 10 is used as a temporary substrate which supports a thin film metal layer, and is peeled off and removed from the metal layer later. For this purpose, a releasing agent formed of silicone, or the like is coated on the surface of the supporting body 10. In the case that the supporting body 10 is formed of a fluororesin film, the releasing agent may be omitted.

Figure 3B:
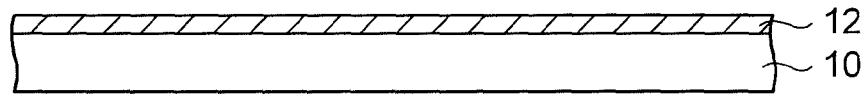

Then, as depicted in FIG. 3B, a copper (Cu) layer 12 is formed on the supporting body 10 by the sputter method, the vapor deposition method, the ion plating method, the CVD method, or the like. A thickness of the copper layer 12 is set in the range from 10 nm to 5000 nm, preferably from 100 nm to 1000 nm.

Figure 3C:
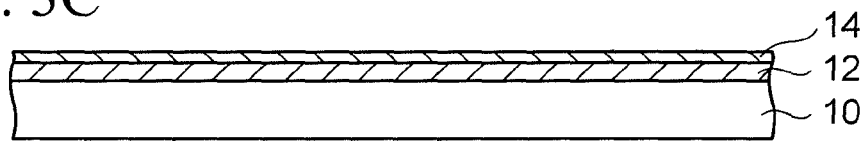

Then, as depicted in FIG. 3C, a tin (Sn) layer 14 is formed on the copper layer 12 by the sputter method, the vapor deposition method, the ion plating method, the CVD method, the chemical plating method, the electroplating method, or the like. A thickness of the tin layer 14 is set in the range from 1 nm to 1000 nm, preferably from 10 nm to 100 nm.

Figure 3D:
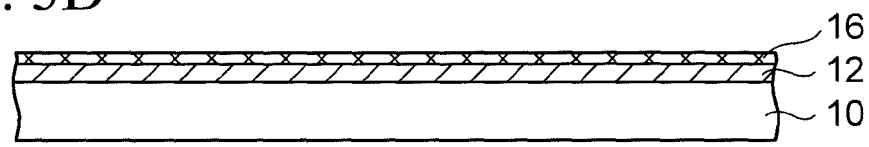

Then, as depicted in FIG. 3D, the heating process is applied to a structural body in FIG. 3C at a temperature of 100° C. to 150° C. Thus, the copper diffuses from the copper layer 12 to the tin layer 14, and the tin layer 14 is alloyed to produce a first copper tin alloy layer 16.

Here, in the case that the stage on which the supporting body 10 is placed is heated to about 100° C. by the sputter method, or the like, the first copper tin alloy layer 16 can be obtained by depositing the tin layer 14.

Here, it is desirable that a thickness of the tin layer 14 should be adjusted such that the whole amount of the formed tin layer 14 can be alloyed.

Alternatively, the first copper tin alloy layer 16 may be formed directly on the copper layer 12 by the sputter method, in which a composite target made of a copper tin alloy is employed, or the like.

In the case that the first copper tin alloy layer 16 is obtained after the tin layer 14 is formed, either the whole tin layer 14 may be changed into the first copper tin alloy layer 16, or the major part of the tin layer 14 may be changed into the first copper tin alloy layer 16 and the tin layer 14 which is not alloyed may be still left in a part of the surface side.

Also, the tin layer 14 which is not alloyed, on the surface side, may be removed by the wet etching selectively with respect to the first copper tin alloy layer 16. By this matter, the very thin first copper tin alloy layer 16 can be formed uniformly on the supporting body 10.

Alternatively, the tin layer 14 can be changed into the first copper tin alloy layer 16 by the heating process when forming the first coupling agent layer described later.

Here, when the tin layer 14 or the first copper tin alloy layer 16 is deposited, the metal such as silver (Ag), nickel (Ni), bismuth (Bi), indium (In), or the like may be included. For example, in the case that the tin layer 14 is formed by the chemical plating, sometimes the silver (Ag) may be added in order to prevent occurrence of the whisker (needle-shaped metal crystal).

In this manner, a structural body in which the copper layer 12 and the first copper tin alloy layer 16 are formed in sequence in a peelable condition on the supporting body 10 is prepared.

Figure 3E:
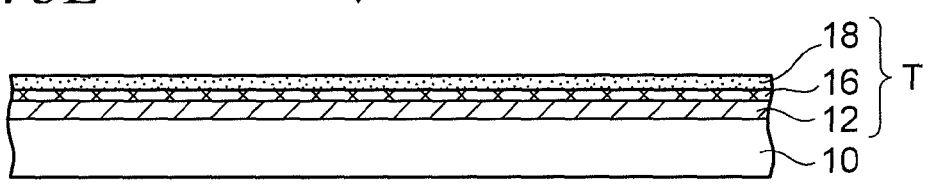

Then, as depicted in FIG. 3E, a first coupling agent layer 18 is formed on the first copper tin alloy layer 16. The first coupling agent layer 18 has two kinds of functional groups whose reactivity is different respectively in one molecule. As the typical one, there is the silane coupling agent.

In the silane coupling agent, as the functional group that is chemically bonded to the organic material such as a resin, or the like, the functional group including an amino group, an epoxy group, a mercapto group, an isocyanate group, a methacryloxy group, an acryloxy group, a ureido group, a sulfide group, or the like is preferable. The suitable functional group may be selected in response to the kind of the resin which is chemically bonded to the silane coupling agent.

Also, in the silane coupling agent, as the functional group which is chemically bonded to the inorganic material such as metal, or the like, the functional group including a silanol group, a methoxy group, or an ethoxy group is preferable. The suitable functional group may be selected in response to the kind of the metal which is chemically bonded to the silane coupling agent.

Here, as the first coupling agent layer 18, the titanium coupling agent may be employed, in addition to the silane coupling agent.

The supporting body 10 as described above on which the copper layer 12 and the first copper tin alloy layer 16 are formed is dipped in a dilute solution of the silane coupling agent, and is made to contact it, and then is dried. Thus, the first coupling agent layer 18 can be formed on the surface of the first copper tin alloy layer 16 by the dehydration condensation.

A concentration of the dilute solution of the silane coupling agent is set in the range from 0.1% to 10%, preferably from 0.5% to 5%. Also, the drying of the silane coupling agent is executed under the conditions of a temperature: 80° C. to 150° C. and a process time: 1 minute to 60 minutes.

Other than the method of dipping the supporting body 10 in a dilute solution of the silane coupling agent, the first coupling agent layer 18 may be formed on the first copper tin alloy layer 16 on the supporting body 10 by the spray coating or the vapor deposition of the silane coupling agent.

One functional group (the silanol group, or the like) of the first coupling agent layer 18, used to bond the inorganic material, is chemically bonded to the first copper tin alloy layer 16. Thus, the first coupling agent layer 18 is adhered firmly onto the first copper tin alloy layer 16.

With the above, a metal layer transfer base material 1 of the first embodiment is obtained. In the metal layer transfer base material 1, a transfer layer T in which the copper layer 12, the first copper tin alloy layer 16, and the first coupling agent layer 18 are laminated sequentially in a peelable condition is formed on the supporting body 10.

According to the metal layer transfer base material 1 of the first embodiment, the transfer layer T having such a structure that the first coupling agent layer 18 is adhered onto the first copper tin alloy layer 16 whose thickness is made uniform can be formed on the supporting body 10 with good reliability.

Next, a method of transferring the transfer layer T (the copper layer 12, the first copper tin alloy layer 16, and the first coupling agent layer 18) of the metal layer transfer base material 1 of the first embodiment onto the insulating resin layer of the wiring substrate will be explained hereunder.

Figure 4A:
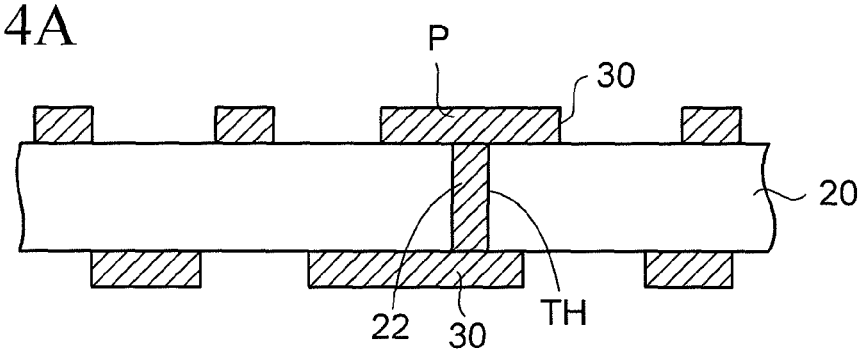
FIGS. 4A to 4C are sectional views (#1) depicting a method of manufacturing a wiring substrate according to the first embodiment.

As depicted in FIG. 4A, first, a core substrate 20 on both surface sides of which an underlayer wiring layer 30 is formed respectively is prepared. A through hole TH which penetrates the substrate in the thickness direction is provided in the core substrate 20, and a penetration electrode 22 is filled in the through hole TH. The underlayer wiring layers 30 on both surface sides are connected mutually via the penetration electrode 22. In the underlayer wiring layer 30 on the upper surface side, a connection pad P thereof is indicated.

Alternatively, the underlayer wiring layers 30 formed on both surface sides of the core substrate 20 may be connected mutually via the through-hole plating layer formed on an inner wall of the through hole TH, and a resin may be filled in the remained hole of the through hole TH.

The core substrate 20 is formed of the insulating material such as a glass epoxy resin, silicon, or the like. In the case that a silicon substrate is used as the core substrate 20, an insulating layer such as a silicon oxide layer, or the like is formed on both surface sides of the core substrate 20 and the inner surface of the through hole TH.

A build-up wiring connected to the underlayer wiring layer 30 is formed on both surface sides of the core substrate 20 respectively. However, in the present embodiment, a build-up wiring is formed only on the upper surface side of the core substrate 20.

Figure 4B:
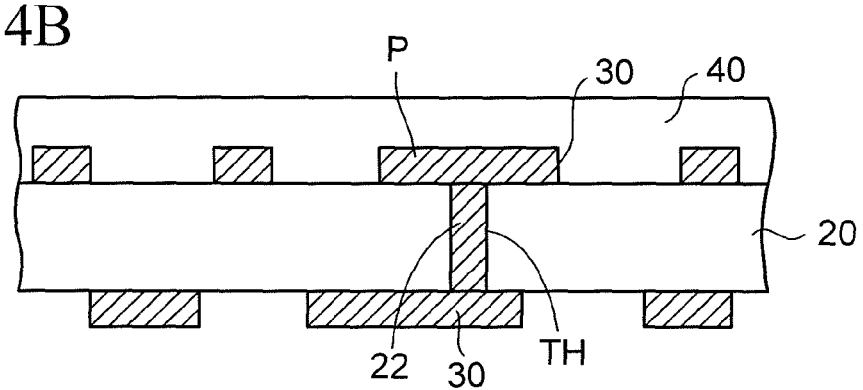

Then, as depicted in FIG. 4B, a resin film kept in a semi-cured state (B-stage) is laminated on the core substrate 20 by the vacuum laminator. Thus, a first insulating resin layer 40 covering the underlayer wiring layer 30 is formed on this underlayer wiring layer 30.

As the first insulating resin layer 40, a thermosetting resin such as an epoxy resin, a polyimide resin, or the like is used. At this point of time, the first insulating resin layer 40 is not cured, and is kept in a semi-cured state (B-stage).

Figure 4C:
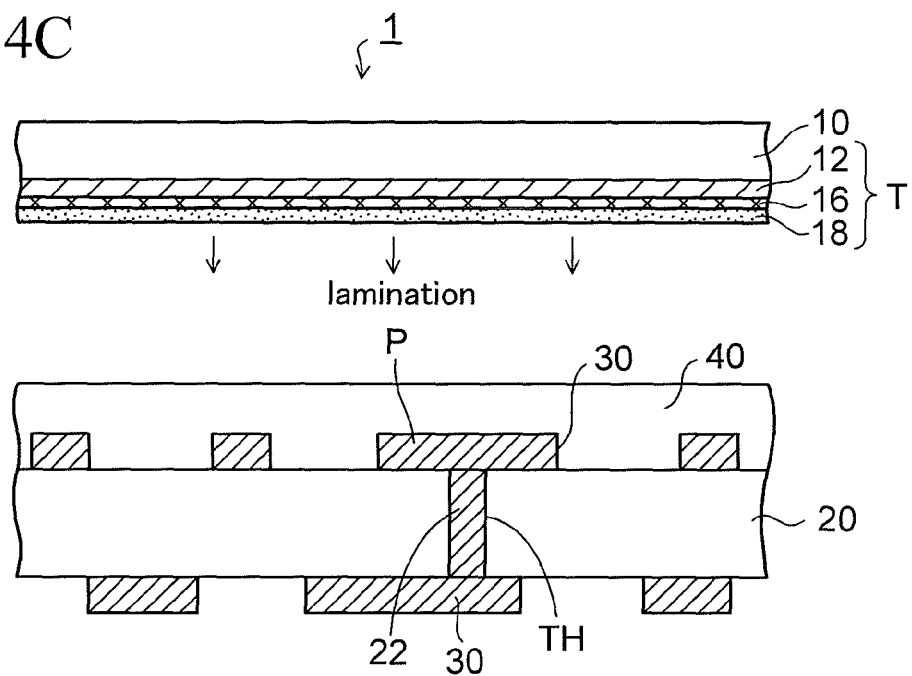

Then, as depicted in FIG. 4C, the above-mentioned metal layer transfer base material 1 (FIG. 3E) is reversed up and down. Then, the surface of the first coupling agent layer 18 of the metal layer transfer base material 1 is laminated on the first insulating resin layer 40 by the vacuum laminator.

Figure 5A:
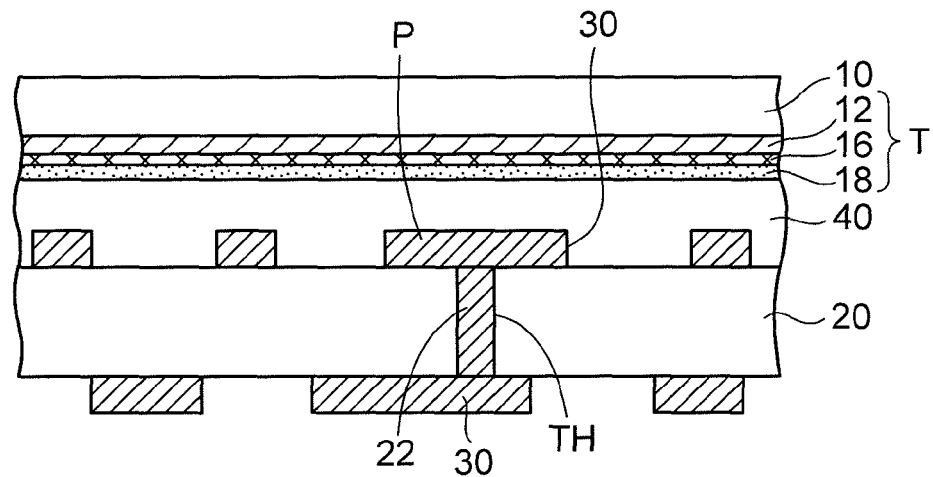
FIGS. 5A and 5B are sectional views (#2) depicting the method of manufacturing the wiring substrate according to the first embodiment.

Then, as depicted in FIG. 5A, the first insulating resin layer 40 kept in a semi-cured state is cured perfectly by applying the heating process. In the case that the first insulating resin layer 40 is formed of an epoxy resin, the heating process is executed at a temperature of 150° C. to 190° C. By this matter, the first coupling agent layer 18 of the metal layer transfer base material 1 can be adhered onto the first insulating resin layer 40. The other functional group (the amino group, or the like) of the first coupling agent layer 18, used to bond the organic material, is chemically bonded to the first insulating resin layer 40, and thus the first coupling agent layer 18 is firmly adhered onto the first insulating resin layer 40.

As a result, the first copper tin alloy layer 16 is firmly adhered onto the first insulating resin layer 40 via the first coupling agent layer 18.

Figure 5B:
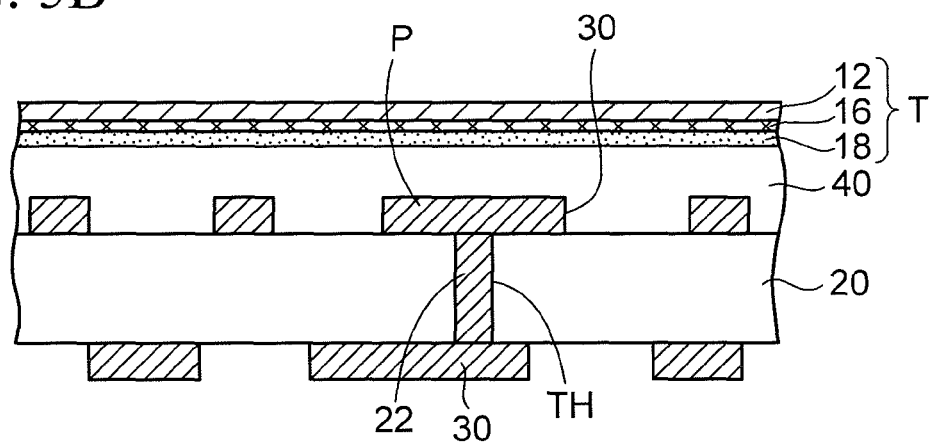

Then, as depicted in FIG. 5B, the supporting body 10 is peeled off along the boundary with respect to the copper layer 12, and thus the upper surface of the copper layer 12 is exposed. At this time, because the releasing agent is formed between the supporting body 10 and the copper layer 12, the supporting body 10 can be peeled off and removed easily. Accordingly, the transfer layer T of the metal layer transfer base material 1 can be transferred and formed onto the first insulating resin layer 40.

In this way, a laminated body in which the first copper tin alloy layer 16 and the copper layer are arranged sequentially on the first coupling agent layer 18, is obtained on the first insulating resin layer 40 covering the underlayer wiring layer 30.

Since the first insulating resin layer 40 is covered and protected with the copper layer 12 prior to the desmear process, the upper surface of the first insulating resin layer 40 is kept in a smooth state. A surface roughness (Ra) of the smooth first insulating resin layer 40 is 10 nm to 200 nm.

The first copper tin alloy layer 16 has such a characteristic that it can be adhered onto the first insulating resin layer 40 (the epoxy resin, or the like) by the first coupling agent layer 18 (the silane coupling agent) with good reliability. The method of transferring the transfer layer T of the metal layer transfer base material 1 of the present embodiment is employed, and thus the first insulating resin layer 40 and the first copper tin alloy layer 16 can be adhered mutually via the first coupling agent layer 18 with good reliability.

If no problem arises, the first coupling agent layer 18 may be directly formed on the first insulating resin layer 40, and then the first copper tin alloy layer 16 and the copper layer 12 may be formed thereon by the sputter method, or the like.

Figure 6A:
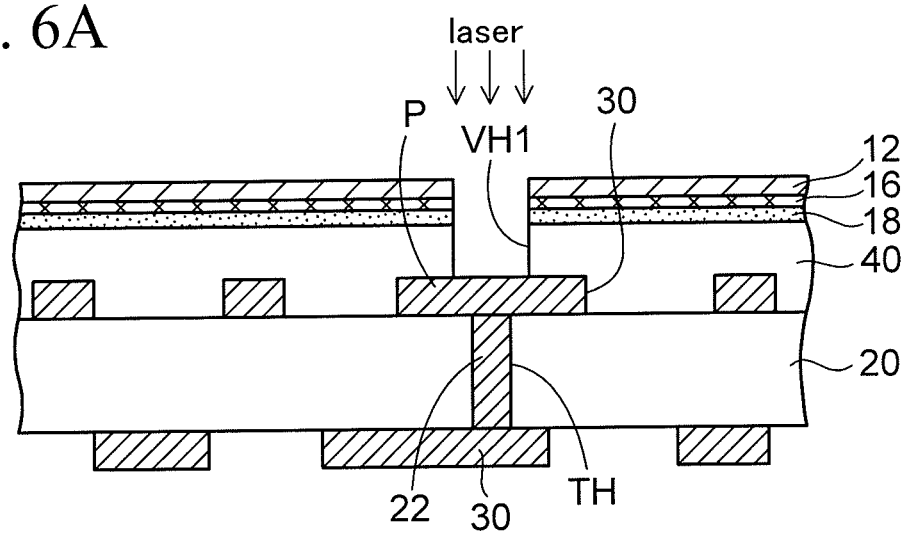
FIGS. 6A and 6B are sectional views (#3) depicting the method of manufacturing the wiring substrate according to the first embodiment.

Subsequently, as depicted in FIG. 6A, the copper layer 12, the first copper tin alloy layer 16, the first coupling agent layer 18, and the first insulating resin layer 40 are processed in the thickness direction by the laser. Thus, a first via hole VH1 reaching the connection pad P of the underlayer wiring layer 30 is formed. The laser process is executed by using the carbon dioxide laser or the UV-YAG laser.

Figure 6B:
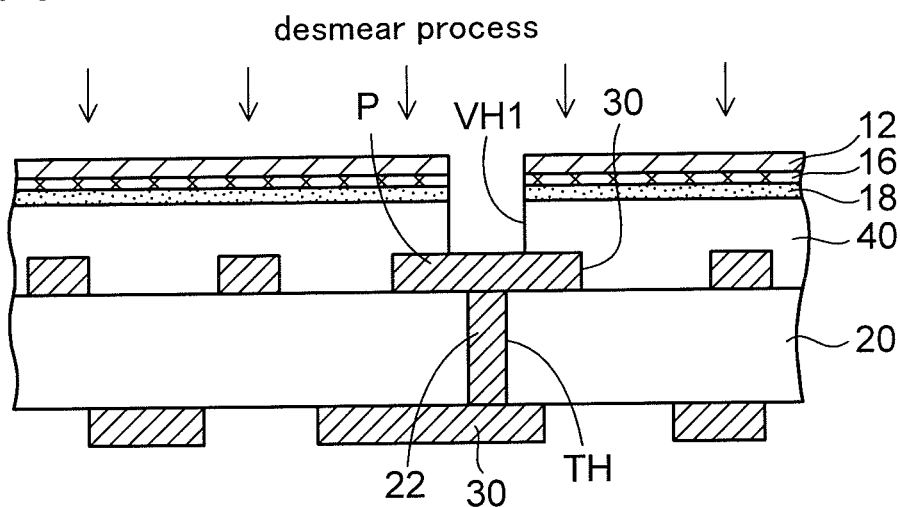

Then, as depicted in FIG. 6B, the desmear process is applied to the inside of the first via hole VH1 by using the wet process such as the permanganate process, or the like. By this matter, the resin smears remained in the inside of the first via hole VH1, etc. can be removed, and the inside of the first via hole VH1 can be cleaned.

Also, at this time, the releasing agent adhered onto the copper layer 12 is removed simultaneously.

At this time, the copper layer 12 is hardly etched by the desmear process using the permanganate process, or the like, and the first insulating resin layer 40 is protected with the copper layer 12. Thus, the surface of the first insulating resin layer 40 is never roughened by the desmear process. Therefore, the surface of the first insulating resin layer 40 is maintained in a smooth state (surface roughness (Ra): 10 nm to 200 nm).

In this event, the sidewall of the first via hole VH1 is roughened by the desmear process. Therefore, a seed layer described later can be formed on the inside of the first via hole VH1 with good adhesion.

As the desmear process, the wet process such as the permanganate process, or the like is illustrated. But the desmear process may be executed by using the plasma of a gas including a fluorine atom, such as a $CF_4/O_2$ based gas, or the like (dry process). Also in the desmear process based on the dry process, the copper layer 12 is hardly etched, and the first insulating resin layer 40 is protected with the copper layer 12. As a result, the surface of the first insulating resin layer 40 is never roughened.

Figure 7A:
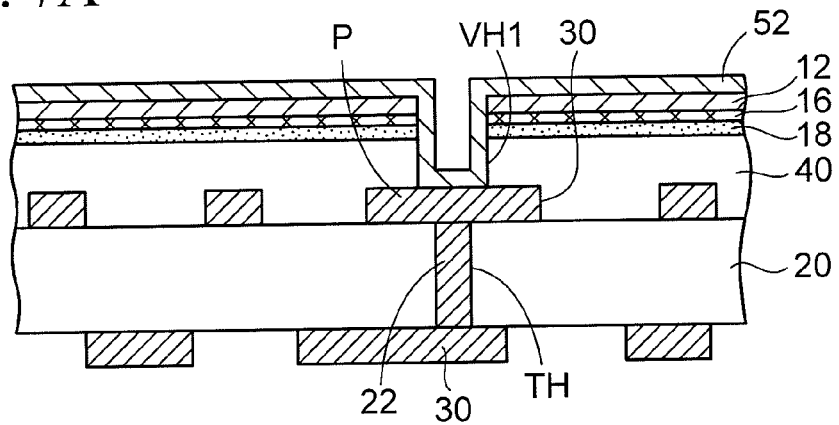
FIGS. 7A to 7C are sectional views (#4) depicting the method of manufacturing the wiring substrate according to the first embodiment.

Then, as depicted in FIG. 7A, a seed layer 52 made of copper is formed on the copper layer 12 and the inner surface of the first via hole VH1 by the electroless plating. A thickness of the seed layer 52 is about 0.5 μm, for example, and is set to such a thickness that the inner surface of the first via hole VH1 can be covered surely. The seed layer may be formed by the sputter method instead of the electroless plating.

At this time, as described above, the first copper tin alloy layer 16 and the copper layer 12 are already formed on the first insulating resin layer 40 via the first coupling agent layer 18 in a good adhesion condition. For this reason, the seed layer 52 can be formed on the first insulating resin layer 40 via the copper layer 12, or the like with good adhesion.

This is because the seed layer 52 (Cu) cannot obtained enough adhesion when this seed layer is directly formed on the smooth first insulating resin layer 40, nevertheless the seed layer 52 can be formed on the metal layer such as the copper layer 12, or the like with good adhesion.

Figure 7B:
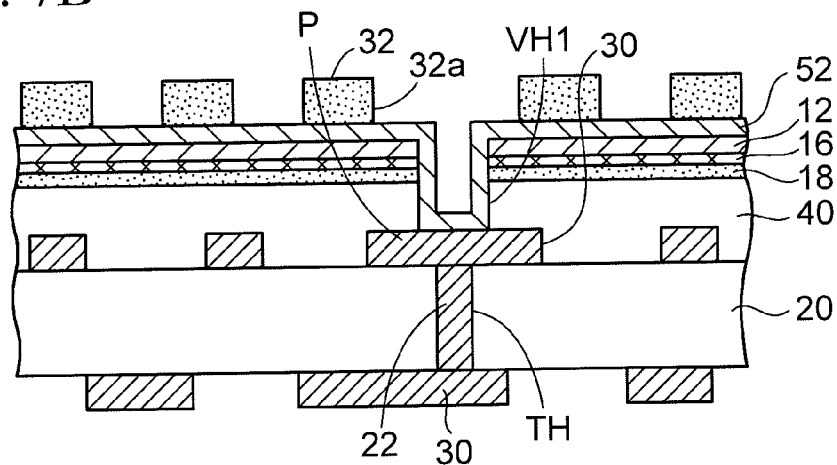

Then, as depicted in FIG. 7B, a plating resist 32 in which an opening portion 32a is provided in the part which includes the first via hole VH1 (the part in which the first wiring layer is arranged) is formed on the seed layer 52 by the photolithography. As the method of forming the plating resist 32, either a dry film resist may be pasted or a liquid resist may be coated and formed.

Figure 7C:
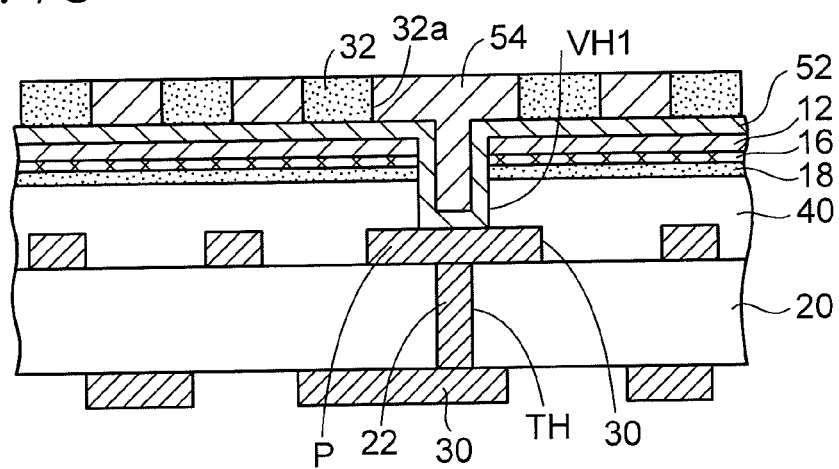

Then, as depicted in FIG. 7C, a metal plating layer 54 made of copper is formed in the first via hole VH1 and the opening portion 32a of the plating resist 32 by the electroplating utilizing the seed layer 52 as a plating power feeding path. At this time, the copper layer 12 and the first copper tin alloy layer 16 underlying the seed layer 52 are utilized as a part of the plating power feeding path as well.

A thickness of the metal plating layer 54 may be set arbitrarily so as to obtain a desired wiring resistance. For example, in the case that a line width of the first wiring layer is 10 μm, a thickness of the metal plating layer 54 is set in the range about from 10 μm to 20 μm. In the first via hole VH1, the metal plating is applied inwardly from the seed layer 52 formed on the inner surface of the via hole VH1, and thus a via conductor is filled in the first via hole VH1.

Figure 8:
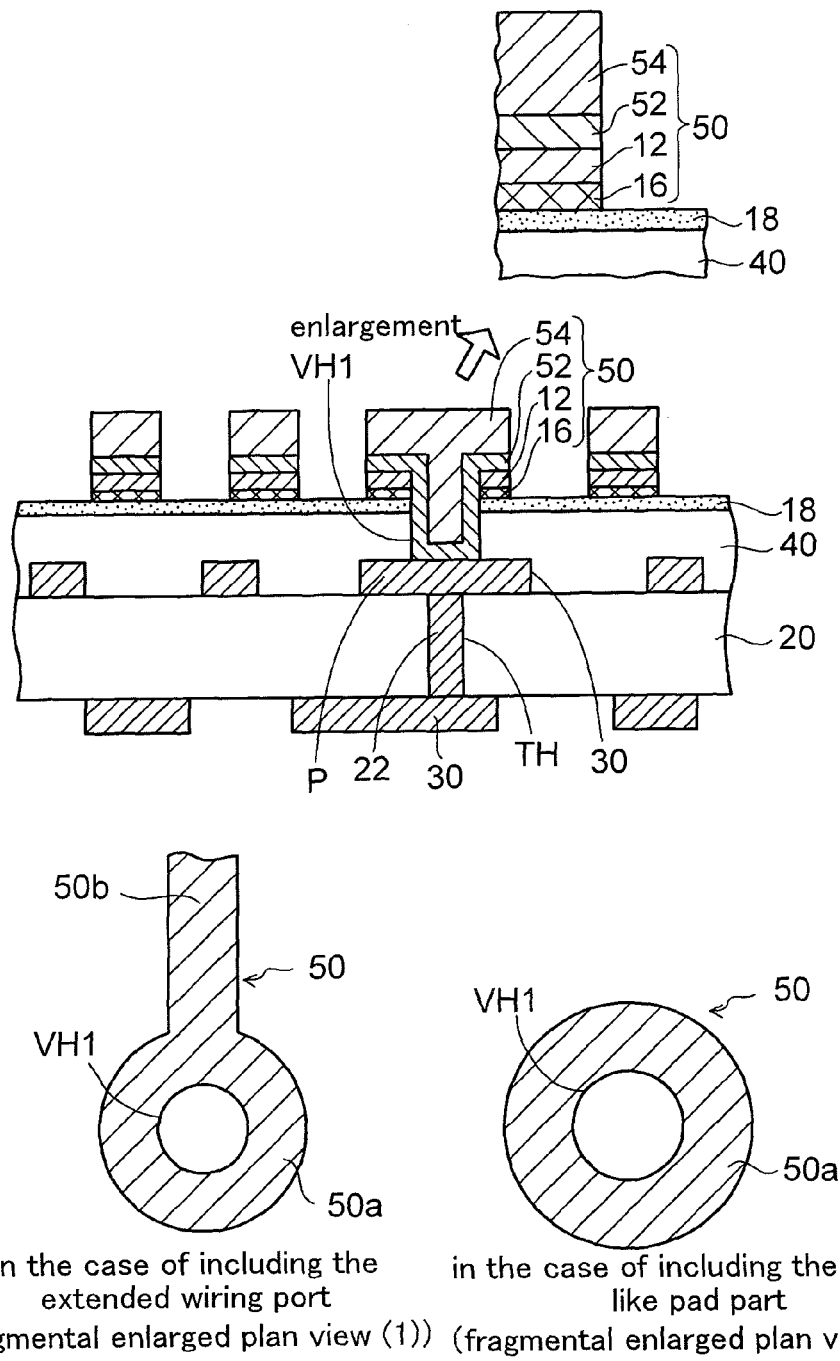
FIG. 8 is a sectional view and a plan view (#5) depicting the method of manufacturing the wiring substrate according to the first embodiment.

Subsequently, as depicted in FIG. 8, the plating resist 32 is removed, and then the seed layer 52 (Cu) and the copper layer 12 and the first copper tin alloy layer 16, both formed under this seed layer, are removed by the wet etching while using the metal plating layer 54 as a mask. At this time, a nitric acid aqueous solution whose concentration is 10% to 20% is used as an etchant of the wet etching, and respective layers from the seed layer 52 (Cu) to the first copper tin alloy layer 16 are etched successively by this nitric acid aqueous solution.

Accordingly, a first wiring layer 50 formed of the first copper tin alloy layer 16, the copper layer 12, the seed layer 52, and the metal plating layer 54 can be obtained on the first insulating resin layer 40 (the first coupling agent layer 18). The first wiring layer 50 is formed to be connected electrically to the connection pad P of the underlayer wiring layer 30 via the first via hole VH1 (via conductor).

In the present embodiment, the surface of the first insulating resin layer 40 is smooth. Therefore, when the seed layer 52, the copper layer 12, and the first copper tin alloy layer 16 are etched by the semi-additive process, the residue is hard to occur.

Accordingly, the first wiring layer 50 having a narrow pitch, the line: space of which is in a range of 10 μm: 10 μm to 2 μm: 2 μm, can be formed with good yield. Also at this time, it is not necessary to execute the over-etching amount with an excessive extent. Therefore, the first wiring layer 50 never causes the pattern jump even in the fine pattern.

Also, even though the surface of the first insulating resin layer 40 is smooth, the first copper tin alloy layer 16 as the lowermost layer of the first wiring layer 50 can be firmly adhered onto the first insulating resin layer 40 by using the first coupling agent layer 18.

In this manner, the fine first wiring layer 50 can be formed on the smooth upper surface of the first insulating resin layer 40 with good adhesion. Therefore, an extent of unevenness of the first wiring layer 50 can be decreased, and as a result it can be avoided that a transmission loss of the high-frequency signal occurs.

As depicted in a fragmental enlarged plan view (1) of FIG. 8, in the case that the first wiring layer 50 has a pad part 50a arranged in the first via hole VH1 and an extended wiring part 50b connected to this pad part 50a and extended outward, the first copper tin alloy layer 16 and the copper layer 12 are arranged in respective areas of the pad part 50a except the first via hole VH1 (the outer peripheral part of the first via hole VH1) and the extended wiring part 50b as their lowermost layer (hatched portions).

Alternatively, as depicted in a fragmental enlarged plan view (2) of FIG. 8, in the case that the first wiring layer 50 is arranged to the first via hole VH1 as an island-like pad part 50a, the first copper tin alloy layer 16 and the copper layer 12 are arranged like a ring shape in the area of the pad part 50a except the first via hole VH1 as its lowermost layer (hatched portions).

In the fragmental enlarged plan views (1) and (2) of FIG. 8, only the first via hole VH1 and the first wiring layer 50 are schematically depicted.

Here, in the present embodiment, the first wiring layer 50 is connected to the underlayer wiring layer 30 via the first via hole VH1. But, the first wiring layer 50 may be formed on the first insulating resin layer 40, in which the first via hole VH1 is not formed, by the above-mentioned method. That is, the first wiring layer 50 may be connected to the via hole, or may not be connected to the via hole.

Then, as depicted in FIG. 9A, a tin layer is formed selectively on exposed surfaces (an upper surface and side surfaces) of the first wiring layer 50 by the electroless plating. Then, the copper is diffused from the first wiring layer 50 to the tin layer by applying the heating process to obtain a second copper tin alloy layer 56. The first wiring layer 50 is formed to further include the second copper tin alloy layer 56 on the upper surface and the side surfaces.

Thus, such a situation is obtained that the whole outer surface (the upper and lower surfaces and both side surfaces) of the first wiring layer 50, which is not connected to the first via hole VH1, is covered with the first and second copper tin alloy layers 16, 56.

Then, as depicted in FIG. 9B, by the method similar to the above method of forming the first coupling agent layer 18, a second coupling agent layer 18a is formed on the first wiring layer 50 and the first coupling agent layer 18.

After this, as depicted in FIG. 10A, by the method similar to the method of forming the first insulating resin layer 40, a second insulating resin layer 42 is formed on the second coupling agent layer 18a covering the first wiring layer 50.

The second insulating resin layer 42 can be formed on the second copper tin alloy layer 56 of the first wiring layer 50 by the second coupling agent layer 18a with good adhesion.

Accordingly, on the lower side of the first wiring layer 50, the first copper tin alloy layer 16 can be adhered firmly onto the first insulating resin layer 40 by the first coupling agent layer 18. Also, on the upper side and the side surfaces of the first wiring layer 50, the second copper tin alloy layer 56 can be adhered firmly onto the second insulating resin layer 42 by the second coupling agent layer 18a.

Subsequently, as depicted in FIG. 10B, the above steps explained from FIG. 4C to FIG. 8 are executed. Thus, a second wiring layer 60 which is connected to the first wiring layer 50 via a second via hole VH2 (via conductor) formed in the second insulating resin layer 42, is formed on the second insulating resin layer 42. Although not depicted in detail, the second wiring layer 60 is formed to have the identical structure with that of the first wiring layer 50, and can be formed with good adhesion with respect to the second insulating resin layer 42.

Here, in the case that the design rule of the second wiring layer 60 is loose and there is no need to use the above forming method, the second wiring layer 60 may be formed by the ordinary semi-additive process (the method explained in the preliminary matter).

Then, as depicted in FIG. 11, a solder resist 44 in which an opening portion 44a is provided on connection parts of the second wiring layer 60 respectively is formed on the upper surface side of the core substrate 20. Then, a contact layer C formed of a Ni/Au plating layer, or the like is formed on the connection parts of the second wiring layer 60 respectively.

Similarly, the solder resist 44 in which an opening portion 44a is provided on connection parts of the underlayer wiring layer 30 respectively is formed on the lower surface side of the core substrate 20. Then, the contact layer C formed of the Ni/Au plating layer, or the like is formed on the connection parts of the underlayer wiring layer 30 respectively.

With the above, a wiring substrate 2 of the first embodiment is obtained.

Figure 12:
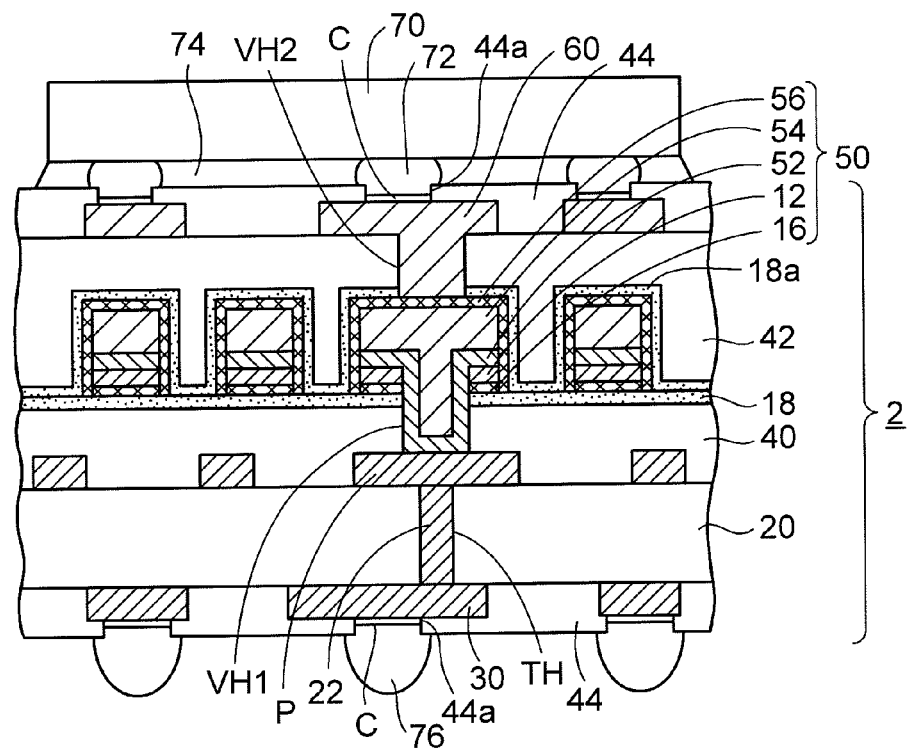
FIG. 12 is a sectional view depicting a state that a semiconductor chip is mounted on the wiring substrate in FIG. 11.

In FIG. 12, such a structure is depicted that a semiconductor chip is mounted on the wiring substrate 2 in FIG. 11. In an example in FIG. 12, a semiconductor chip 70 (LSI chip) is flip-chip connected to the contact layers C of the second wiring layer 60 on the upper surface side via bump electrodes 72 made of solder, or the like.

Then, an underfill resin 74 is filled into a clearance produced under the semiconductor chip 70. Then, an external connection terminal 76 is provided on the contact layers C of the underlayer wiring layer 30 respectively on the lower surface side by mounting a solder ball, or the like.

In the wiring substrate 2 of the first embodiment, as depicted in FIG. 11, the penetration electrode 22 is provided in the core substrate 20. The underlayer wiring layer 30 connected mutually via the penetration electrode 22 is formed on both surface sides respectively.

The first insulating resin layer 40 covering the underlayer wiring layer 30 is formed on the upper surface side of the core substrate 20. The first via hole VH1 reaching the connection pad P of the underlayer wiring layer 30 is formed in the first insulating resin layer 40.

The first coupling agent layer 18 is formed on the area of the first insulating resin layer 40 except the first via hole VH1. The first wiring layer 50 connected to the connection pad P of the underlayer wiring layer 30 via the first via hole VH1 (via conductor) is formed on the first coupling agent layer 18.

The first wiring layer 50 includes the first copper tin alloy layer 16 formed on the first coupling agent layer 18 to extend outward from the outer periphery of the first via hole VH1, and the copper layer 12 formed on the first copper tin alloy layer 16.

Also, the first wiring layer 50 includes the seed layer 52 extended onto the copper layer 12 from the inner surface of the first via hole VH1, and the metal plating layer 54 formed on the seed layer 52 in a state that this plating layer is filled in the first via hole VH1.

Further, the first wiring layer 50 includes the second copper tin alloy layer 56 which covers the side surfaces of the first copper tin alloy layer 16, the copper layer 12, the seed layer 52, and the metal plating layer 54 and the upper surface of the metal plating layer 54.

In this manner, the first wiring layer 50 is formed of the first copper tin alloy layer 16, the copper layer 12, the seed layer 52, and the metal plating layer 54, and the second copper tin alloy layer 56 covering their exposed surfaces.

The first wiring layer 50 is formed such that the first copper tin alloy layer 16 as the lowermost layer can be formed on the smooth first insulating resin layer 40 by the first coupling agent layer 18 with good adhesion.

Further, the upper surface and the side surfaces of the first wiring layer 50 are covered with the second coupling agent layer 18a, and the second insulating resin layer 42 is formed on the first wiring layer 50 via the second coupling agent layer 18a. Accordingly, the second insulating resin layer 42 can be adhered firmly onto the second copper tin alloy layer 56 of the first wiring layer 50 by the second coupling agent layer 18a.

Like the above, the first wiring layer 50 can have the enough adhesion to the first and second insulating resin layers 40, 42 on the upper and lower sides and the lateral sides.

The second via hole VH2 reaching the first wiring layer 50 is formed in the second insulating resin layer 42 and the second coupling agent layer 18a. Then, the second wiring layer 60 connected to the first wiring layer 50 via the second via hole VH2 (via conductor) is formed on the second insulating resin layer 42. The second wiring layer 60 may be formed in the identical structure with the first wiring layer 50 or may be formed by the ordinary semi-additive process.

Also, the solder resist 44 in which the opening portion 44a is provided on respective connection parts of the underlayer wiring layer 30 and the second wiring layer 60 is formed on both surface sides of the core substrate 20 respectively, and the contact layer C is formed on the connection parts respectively.

In the wiring substrate 2 of the first embodiment, the first wiring layer 50 includes the first copper tin alloy layer 16 as its lowermost layer, and the first copper tin alloy layer 16 is adhered firmly onto the smooth first insulating resin layer 40 by the first coupling agent layer 18.

In the present embodiment, the first copper tin alloy layer 16 can be formed on the first insulating resin layer 40 by the first coupling agent layer 18 with good adhesion. As a result, there is no necessity to roughen the surface of the first insulating resin layer 40 by the desmear process.

That is, by employing the first coupling agent layer 18 and the first copper tin alloy layer 16, the first wiring layer 50 can be formed on the smooth first insulating resin layer 40 with good adhesion. Further, since the first wiring layer 50 can be formed on the smooth first insulating resin layer 40, the residue is hard to occur at a time of etching the seed layer 52, etc. in the semi-additive process, and the fine first wiring layer 50 can be formed with good yield.

Furthermore, an extent of unevenness of the first wiring layer 50 can be decreased because the first wiring layer 50 is formed on the smooth first insulating resin layer 40, and as a result such a situation can be avoided that a transmission loss of the high-frequency signal occurs.

In order to check the effect of the wiring substrate 2 of the present embodiment, the inventors of this application formed the metal layer including the copper tin alloy layer on the insulating resin layer via the coupling agent layer, and then investigated peeling strength of the metal layer. Also, the inventor of this application removed the metal layer and then investigated a surface roughness of the insulating resin layer.

Figure 13A:
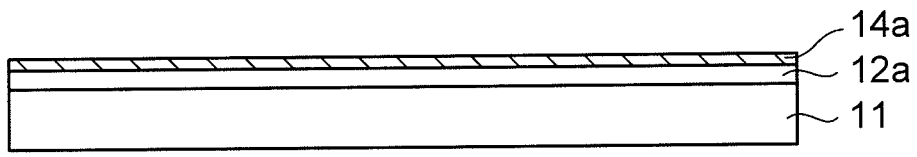
FIGS. 13A to 13D are sectional views depicting a method of manufacturing an embodiment sample used to measure peeling strength.

As an embodiment sample corresponding to the present embodiment, as depicted in FIG. 13A, first, a copper layer 12a whose thickness is 500 nm was formed on a PET film 11 by the sputter method, and then a tin layer 14a whose thickness is 100 nm was formed on the copper layer 12a by the sputter method.

Figure 13B:
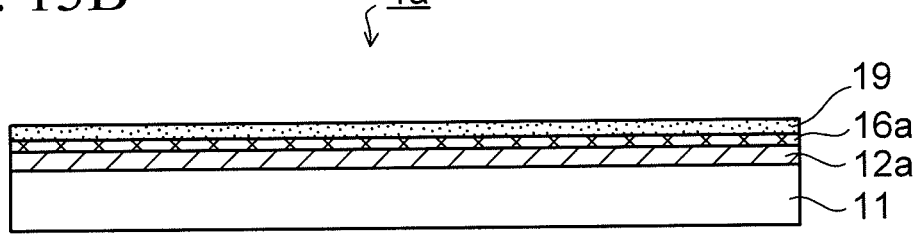

Then, as depicted in FIG. 13B, the PET film was dipped in a 1 vol % aqueous solution of 3-aminopropyltrimethoxysilane (room temperature) for 1 minute, and dried in the atmosphere of temperature: 120° C. for 30 minute. Thus, a silane coupling agent layer 19 was formed. The copper was diffused to the tin layer 14a from the copper layer 12a by the heating process applied when the silane coupling agent layer 19 was formed. Thus, a copper tin alloy layer 16a was obtained.

In this manner, a metal layer transfer base material 1a in which the copper layer 12a, the copper tin alloy layer 16a, and the silane coupling agent layer 19 were formed in sequence on the PET film 11 was made.

Figure 13C:
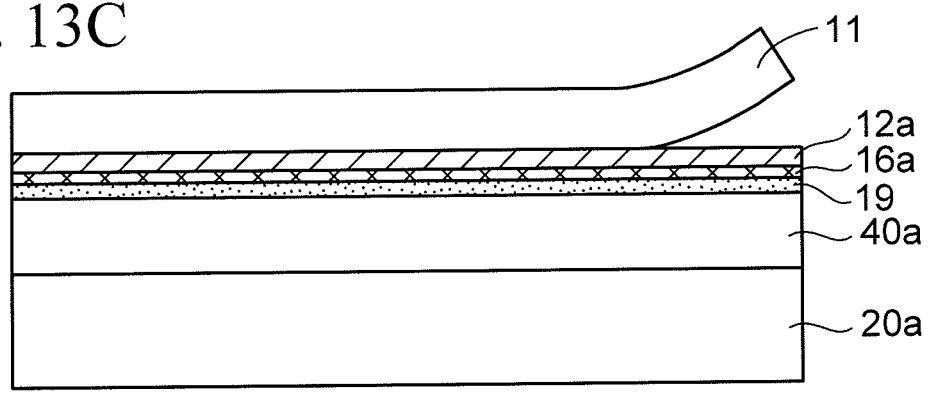

Then, as depicted in FIG. 13C, an epoxy resin film of a thickness: 40 μm was laminated on a glass epoxy substrate 20a by the vacuum laminator. Thus, a semi-cured insulating resin layer 40a was formed.

Then, the surface of the silane coupling agent layer 19 of the above metal layer transfer base material 1a was laminated on the insulating resin layer 40a, and then the semi-cured insulating resin layer 40a was cured by the heating process. After this, the PET film 11 was peeled off and removed.

Figure 13D:
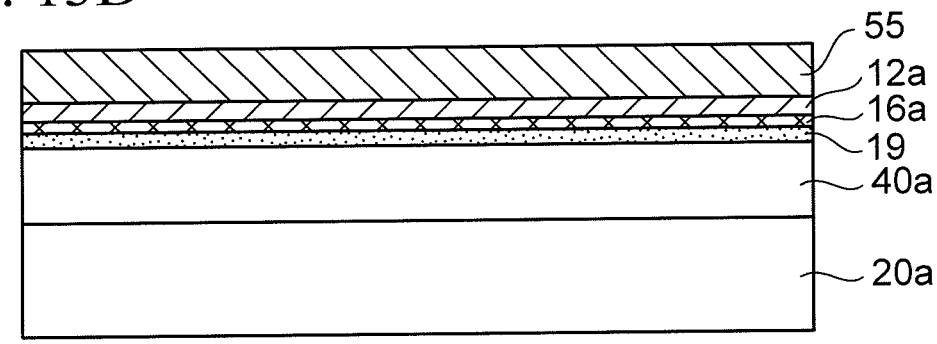

Subsequently, as depicted in FIG. 13D, the desmear process was applied to the exposed copper layer 12a by using the permanganate process, and then the degreasing process and the acid cleaning were applied to the copper layer 12a. Then, a copper plating layer 55 whose thickness was 35 μm was formed by the electroplating. After this, the heating process was applied in the atmosphere of temperature: 180° C. for 60 minute.

In this way, the embodiment sample is obtained by forming the metal layer corresponding to the above-mentioned first wiring layer 50 on the whole surface of the insulating resin layer 40a.

Also, in FIGS. 13A to 13D, such a structure is used as a comparative sample 1 that the tin layer 14a is omitted but only the copper layer 12a is formed and the silane coupling agent layer 19 is not used.

Also, in FIGS. 13A to 13D, such a structure is used as a comparative sample 2 that the silane coupling agent layer 19 is not used.

Also, in FIG. 13C, such a structure is used as a comparative sample 3 that the desmear process is applied to the insulating resin layer 40a by the permanganate process, the copper layer (seed layer) is formed by the electroless plating, and then the copper plating layer 55 is formed by the electroplating.

Next, the static material testing machine (EZ-Graph (manufactured by Shimadzu Corporation)) was used in the peel strength measurement, and then peel strength of each sample was measured in the condition that a vertical lifting rate is 50 nm/min.

In the embodiment sample and the comparative samples 1 to 3, the peel strength of each sample was measured in the initial stage, after HAST (Highly Accelerated temperature and humidity Stress Test) was applied, and after the reflow test was applied, respectively. The conditions of HAST were that a temperature: 130° C., a humidity: 85% RH, and a process time: 100 h. The conditions of the reflow test were that a temperature: 260° C., and the number of processes: 3 times.

Also, in order to evaluate a roughness of the boundary between the insulating resin layer 40a and each metal layer, a surface roughness of the insulating resin layer 40a of each sample was measured after each metal layer was removed. In the measurement of the surface roughness, the scanning probe microscope: Nanopics 1000 (manufactured by SII) was used. DFM (Dynamic Force Mode) was used as the measuring mode, and the measured area was set to 20 μm.

As depicted in FIG. 14, in the embodiment sample, the peel strength in the initial stage was 0.99 kgf/cm, and a change of the peel strength hardly appeared after HAST was applied and after the reflow test was applied.

In contrast, in the comparative sample 1 (only the copper layer+no coupling agent layer), the peel strength in the initial stage was 0.70 kgf/cm, but the peel strength was decreased to 0.49 kgf/cm after HAST was applied and the peel strength was further decreased to 0.24 kgf/cm after the reflow test was applied. It was checked that reliability of the adhesion is not enough.

Also, in the comparative sample 2 (the copper tin alloy layer+no coupling agent layer), the peel strength in the initial stage was 0.75 kgf/cm, but the peel strength was decreased respectively after HAST was applied and the reflow test was applied. It was checked that reliability of the adhesion was not enough.

Further, in the comparative sample 3 (the desmear process+the copper layer formed by the electroless plating), the peel strength in the initial stage was 0.83 kgf/cm, but a reduction of the peel strength appeared respectively after HAST was applied and the reflow test was applied.

As described above, it was found that enough peel strength was obtained when the copper tin alloy layer was adhered onto the insulating resin layer via the coupling agent layer, and also the peel strength was hardly decreased even when the stress was applied.

Also, with respect to the surface roughness of the insulating resin layer 40a, in the embodiment sample and the comparative samples 1, 2, Ra (average roughness) was in a range of 15 nm to 22 nm and Rz (maximum height) was in a range of 100 nm to 130 nm. In the embodiment sample and the comparative samples 1, 2, it was checked that the surface was smooth because the desmear process was not applied.

On the contrary, in the comparative sample in which the desmear process was applied, Ra (average roughness) was 215 nm and Rz (maximum height) was 1430 nm. It was checked that the comparative sample 3 had the value of 10 times or more to the value of the surface roughness of the embodiment sample.

In this manner, in contrast to the method of roughening the surface of the insulating resin layer by the desmear process to attain good adhesion of the metal layer in the prior art, it was found in the present embodiment that, although the surface roughness of the insulating resin layer was 1/10, the peel strength was improved by about 20 percent and also reliability of the adhesion was high.

As a result, the fine wiring layer can be formed on the smooth surface of the insulating resin layer by the semi-additive process with good adhesion.

Second Embodiment

Figure 21:
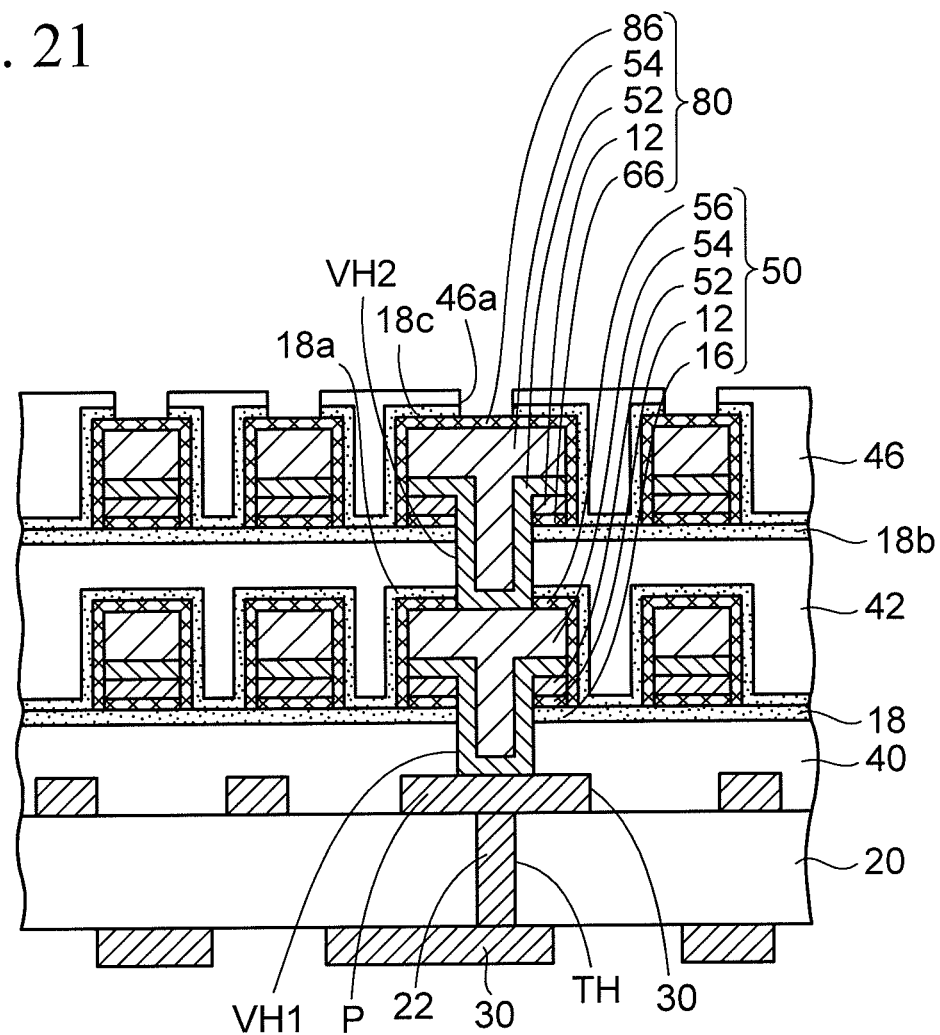
FIG. 21 is a sectional view (#7) depicting the method of manufacturing the wiring substrate according to the second embodiment.
Figure 22:
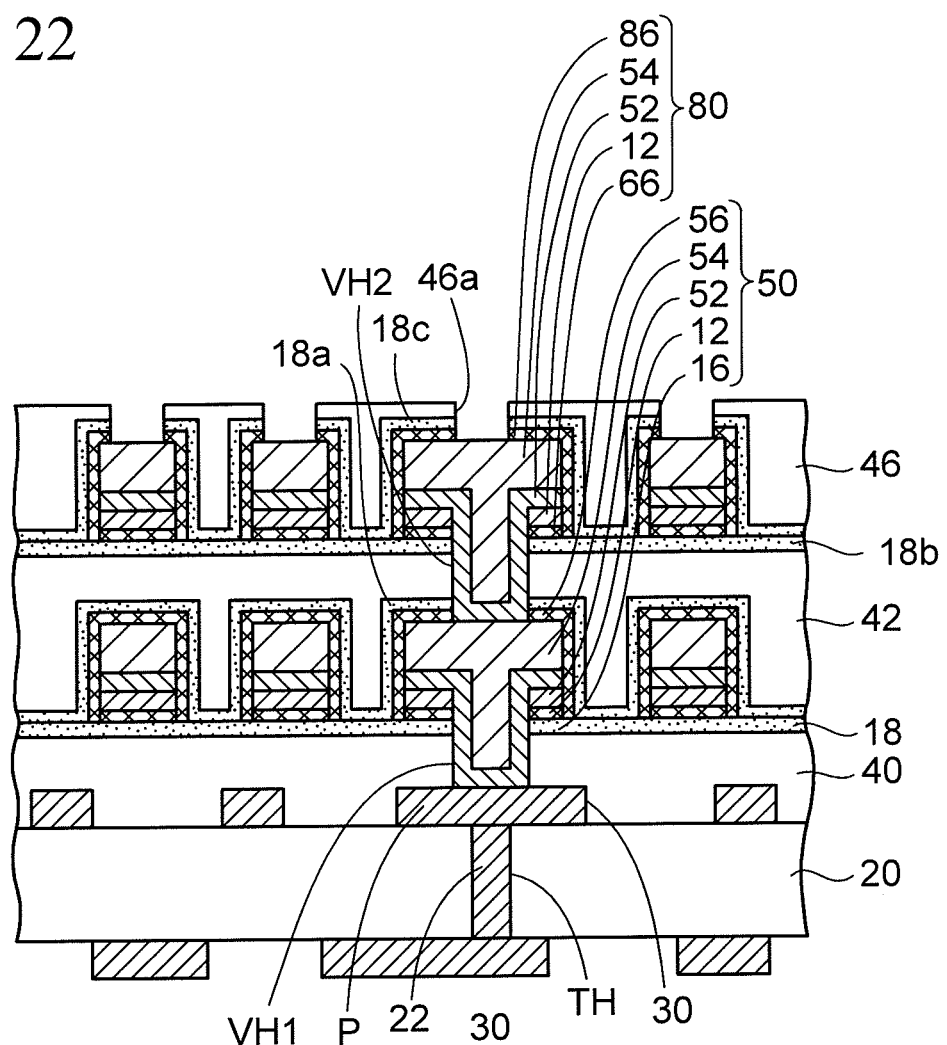
FIG. 22 is a sectional view (#8) depicting the method of manufacturing the wiring substrate according to the second embodiment.
Figure 23:
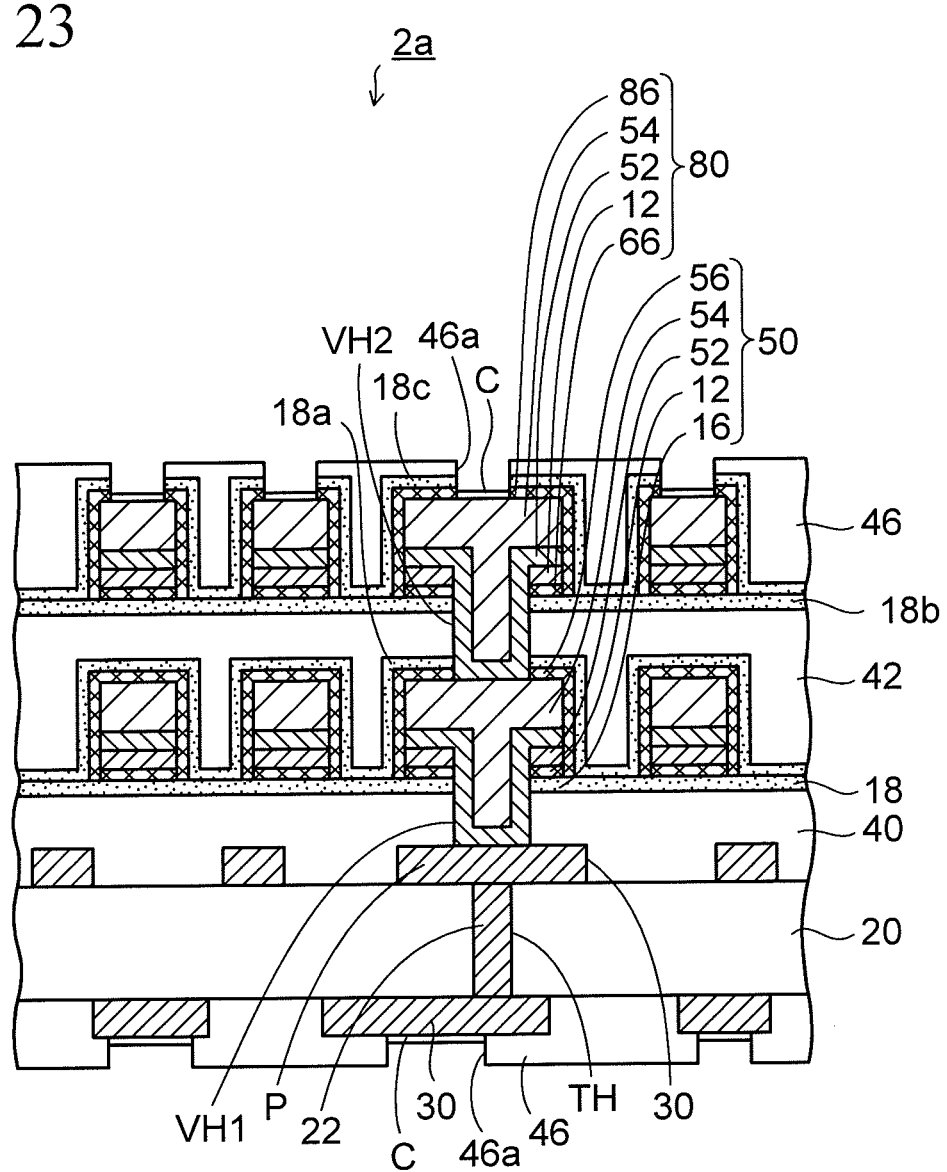
FIG. 23 is a sectional view depicting a wiring substrate according to the second embodiment.

FIG. 15A to FIG. 22 are sectional views depicting a method of manufacturing a wiring substrate according to a second embodiment, and FIG. 23 is a sectional view depicting a wiring substrate according to the second embodiment.

In the second embodiment, the same reference symbols will be affixed to the same elements and the same steps in the first embodiment, and their detailed explanation will be omitted hereunder.

Figure 15A:
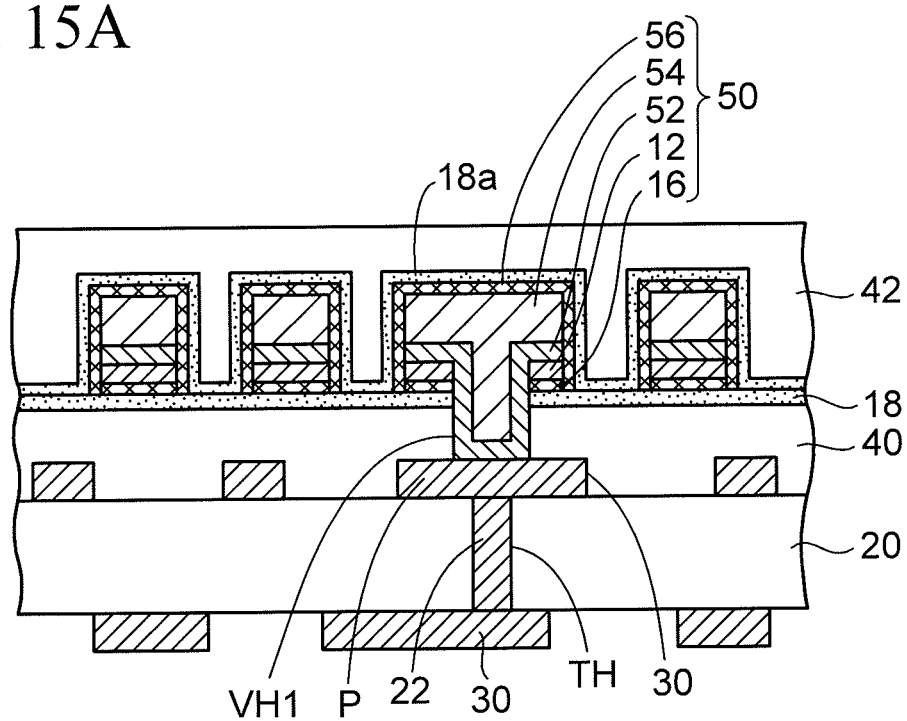
FIGS. 15A and 15B are sectional views (#1) depicting a method of manufacturing a wiring substrate according to a second embodiment.

In the method of manufacturing the wiring substrate according to the second embodiment, as depicted in FIG. 15A, first, the identical structural body with that in FIG. 10A of the first embodiment described above is prepared.

Figure 15B:
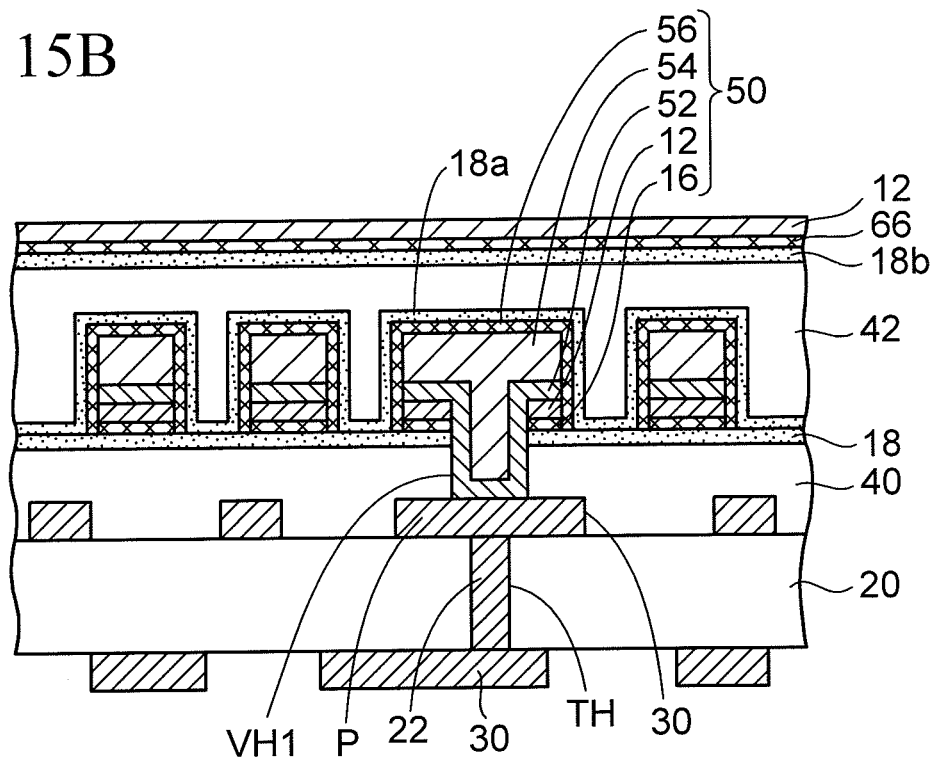

Then, as depicted in FIG. 15B, by the similar method to the steps in FIG. 4C to FIG. 5B of the first embodiment, a laminated body in which a third coupling agent layer 18b, a third copper tin alloy layer 66, and the copper layer 12 are arranged sequentially on the second insulating resin layer 42 is formed.

Figure 16:
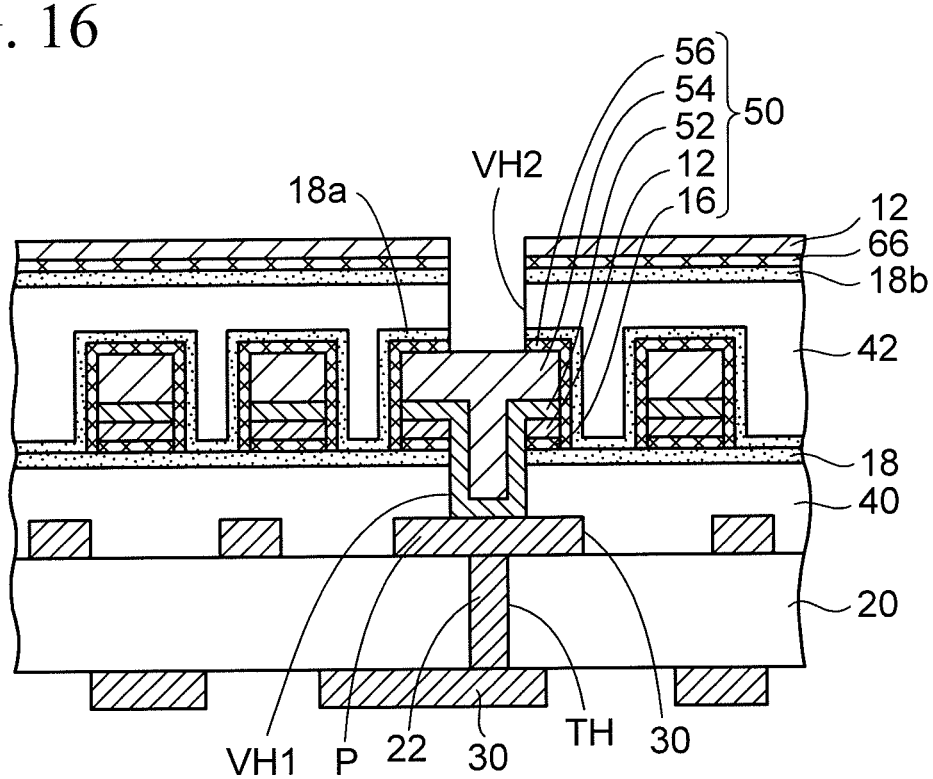
FIG. 16 is a sectional view (#2) depicting the method of manufacturing the wiring substrate according to the second embodiment.

Then, as depicted in FIG. 16, the copper layer 12, the third copper tin alloy layer 66, the third coupling agent layer 18b, the second insulating resin layer 42, the second coupling agent layer 18a, and the second copper tin alloy layer 56 are processed by the laser. Thus, the second via hole VH2 reaching the metal plating layer 54 of the first wiring layer 50 is formed.

In this manner, in the second embodiment, in forming the second via hole VH2, the second copper tin alloy layer 56 of the first wiring layer 50 is removed and thus the metal plating layer 54 is exposed.

Then, like the first embodiment, the desmear process is applied to the inside of the second via hole VH2 by the wet process such as the permanganate process, or the like to clean there.

Here, in forming the second via hole VH2, only the copper layer 12, the third copper tin alloy layer 66, the third coupling agent layer 18b, and the second insulating resin layer 42 may be removed by the laser process, and then the second coupling agent layer 18a and the second copper tin alloy layer 56 may be removed by the desmear process.

Figure 17:
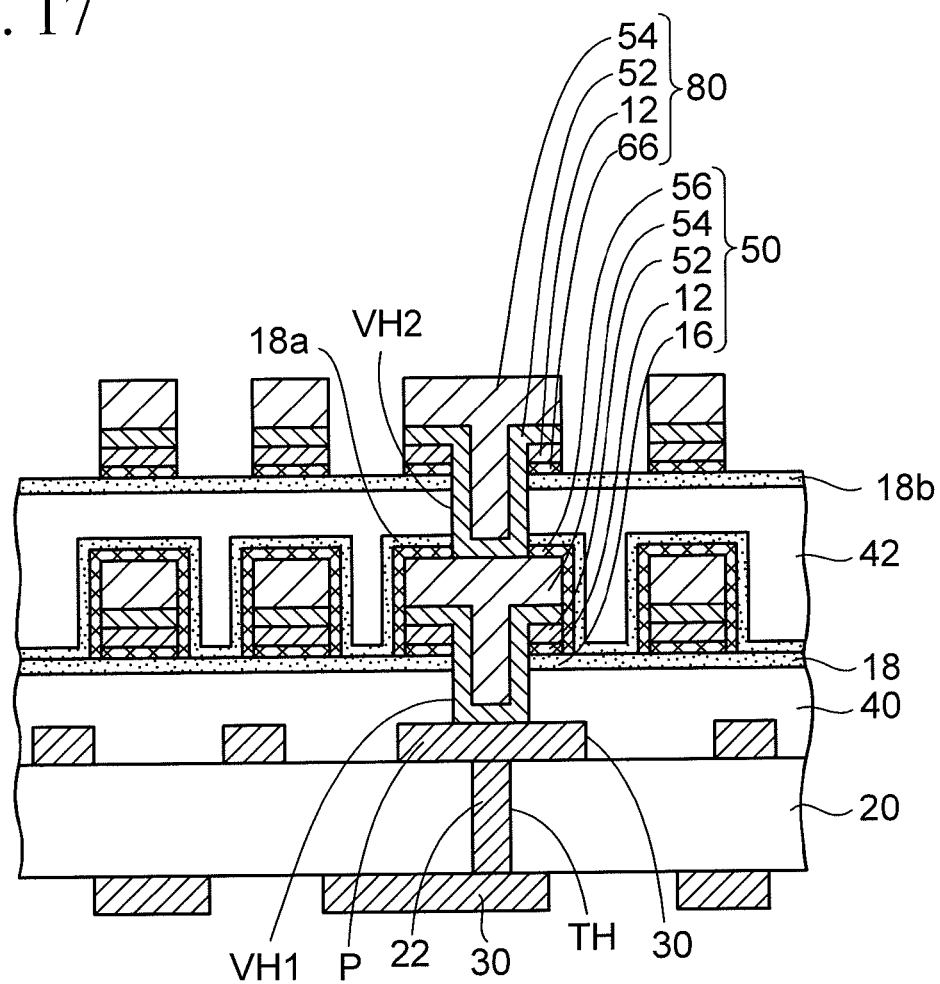
FIG. 17 is a sectional view (#3) depicting the method of manufacturing the wiring substrate according to the second embodiment.

Then, as depicted in FIG. 17, steps of forming the wirings by the semi-additive process that is explained in FIG. 7A through FIG. 8 of the first embodiment are executed. Accordingly, a second wiring layer 80 formed of the third copper tin alloy layer 66, the copper layer 12, the seed layer 52, and the metal plating layer 54 is obtained on the second insulating resin layer 42 via the third coupling agent layer 18b.

At this time, the second copper tin alloy layer 56 of the first wiring layer 50 is removed from the second via hole VH2, and the metal plating layer 54 of the first wiring layer 50 and the seed layer 52 of the second wiring layer 80 are brought into contact with each other and are connected electrically to each other. Preferably the metal plating layer 54 of the first wiring layer 50 and the seed layer 52 of the second wiring layer 80 should be formed of the copper.

Accordingly, the first wiring layer 50 and the second wiring layer 80 are connected electrically via the bonding between the copper and the copper, without the intervention of the second copper tin alloy layer 56 whose electric resistance is relatively high. As a result, a contact resistance between the first wiring layer 50 and the second wiring layer 80 can be reduced in the second via hole VH2, and thus both layers can be connected electrically with good reliability.

Figure 18:
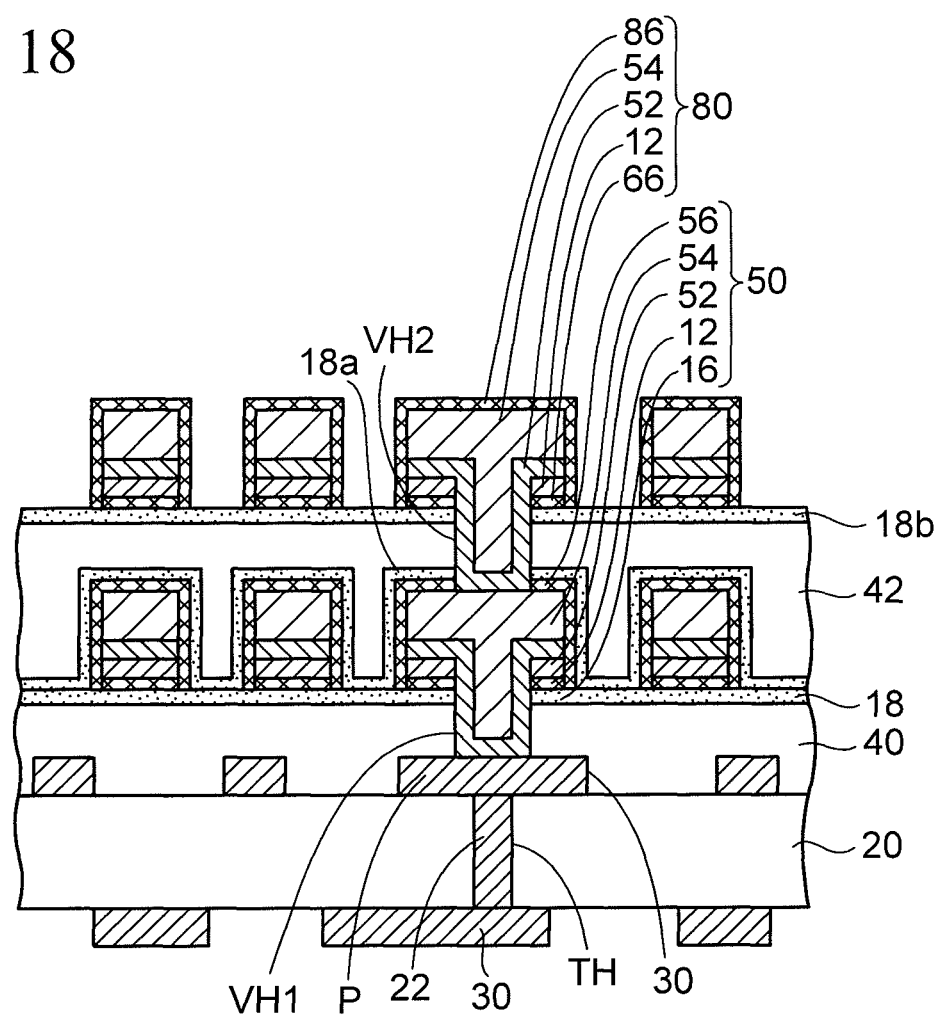
FIG. 18 is a sectional view (#4) depicting the method of manufacturing the wiring substrate according to the second embodiment.

Then, as depicted in FIG. 18, like the steps in FIG. 9B of the first embodiment, the tin layer is formed selectively on the exposed surface of the second wiring layer 80, and then the heating process is applied. Thus, a fourth copper tin alloy layer 86 is obtained by diffusing the copper from the second wiring layer 80. Accordingly, the second wiring layer 80 is formed to include the fourth copper tin alloy layer 86.

Figure 19:
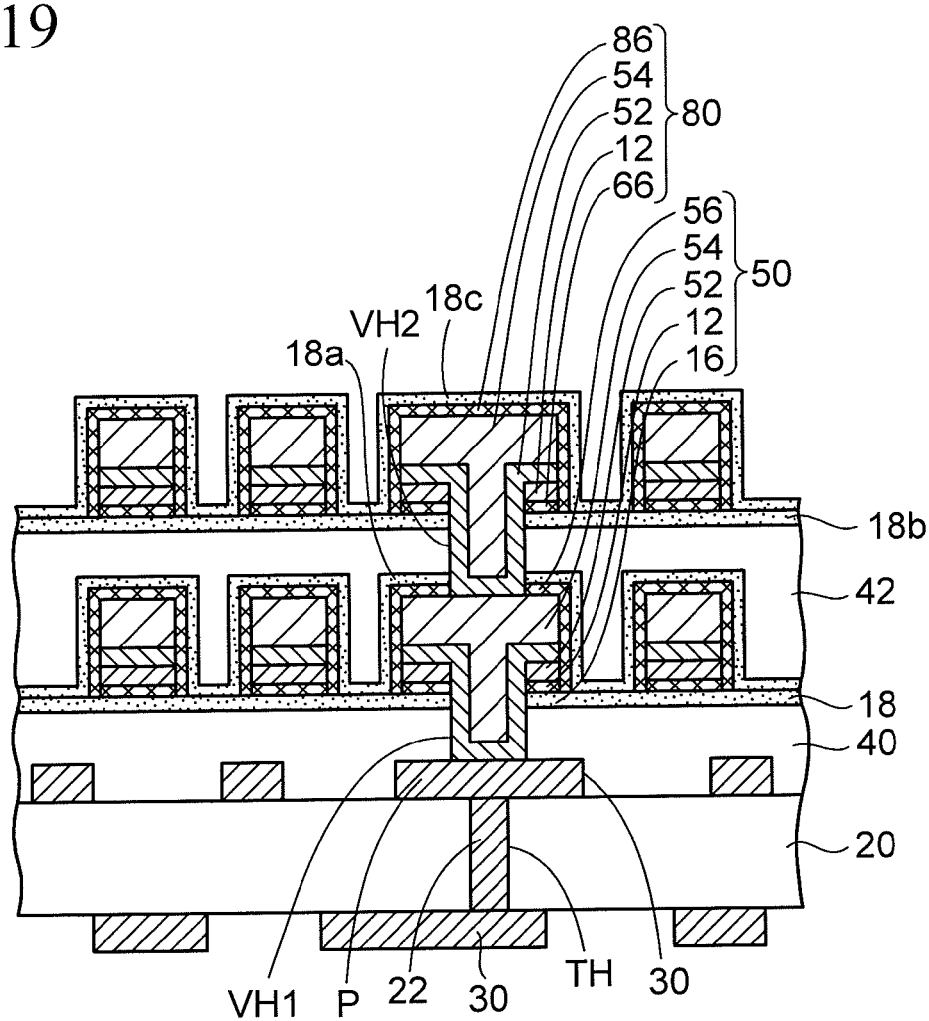
FIG. 19 is a sectional view (#5) depicting the method of manufacturing the wiring substrate according to the second embodiment.

Subsequently, as depicted in FIG. 19, a fourth coupling agent layer 18c is formed on the second wiring layer 80 and the third coupling agent layer 18b.

Figure 20:
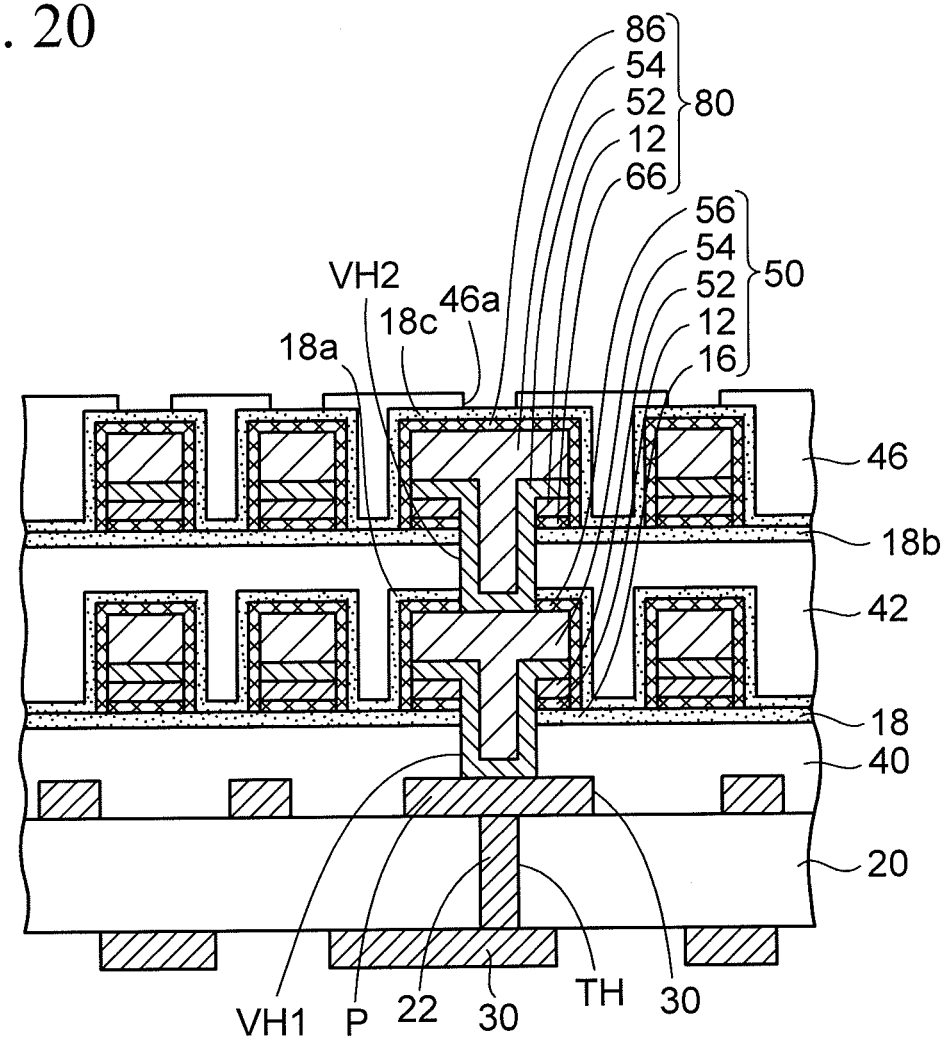
FIG. 20 is a sectional view (#6) depicting the method of manufacturing the wiring substrate according to the second embodiment.

Then, as depicted in FIG. 20, a solder resist 46 in which a opening portion 46a is provided on the parts corresponding to the connection parts of the second wiring layer 80 is formed on the fourth coupling agent layer 18c. The solder resist 46 in which the opening portions 46a are provided is formed by exposing/developing a photosensitive resin based on the photolithography. The solder resist 46 is an example of the protection insulating layer.

The solder resist 46 is adhered firmly onto the fourth copper tin alloy layer 86 of the second wiring layer 80 by the fourth coupling agent layer 18c.

Then, as depicted in FIG. 21, the fourth coupling agent layer 18c in the opening portions 46a of the solder resist 46 is etched by an alkaline etchant and is removed. Alternatively, the fourth coupling agent layer 18c in the opening portions 46a of the solder resist 46 may be etched by the plasma etching and may be removed.

Subsequently, as depicted in FIG. 22, the fourth copper tin alloy layer 86 exposed from the opening portions 46a of the solder resist 46 is etched by an acidic etchant and is removed. The common tin remover can be used as the etchant for the fourth copper tin alloy layer 86.

Accordingly, the metal plating layer 54 of the second wiring layer 80 is exposed from the opening portions 46a of the solder resist 46 as the connection part.

Then, as depicted in FIG. 23, the contact layer C is obtained by forming a Ni/Au plating layer, or the like sequentially from the bottom on the metal plating layers 54 of the second wiring layer 80 in the opening portions 46a of the solder resist 46.

In this manner, in the second embodiment, with respect to the connection parts of the second wiring layer 80, the fourth copper tin alloy layer 86 whose electric resistance is relatively high is removed, and the contact layer C can be directly connected to the metal plating layer 54 made of copper, of the second wiring layer 80.

Similarly, the solder resist 46 in which the opening portion 46a is provided on the connection parts of the underlayer wiring layer 30 is formed on the lower surface side of the core substrate 20. Then, the contact layer C formed of the Ni/Au plating layer, or the like is formed on the connection parts of the underlayer wiring layer 30.

With the above, a wiring substrate 2a of the second embodiment is obtained.

Figure 24:
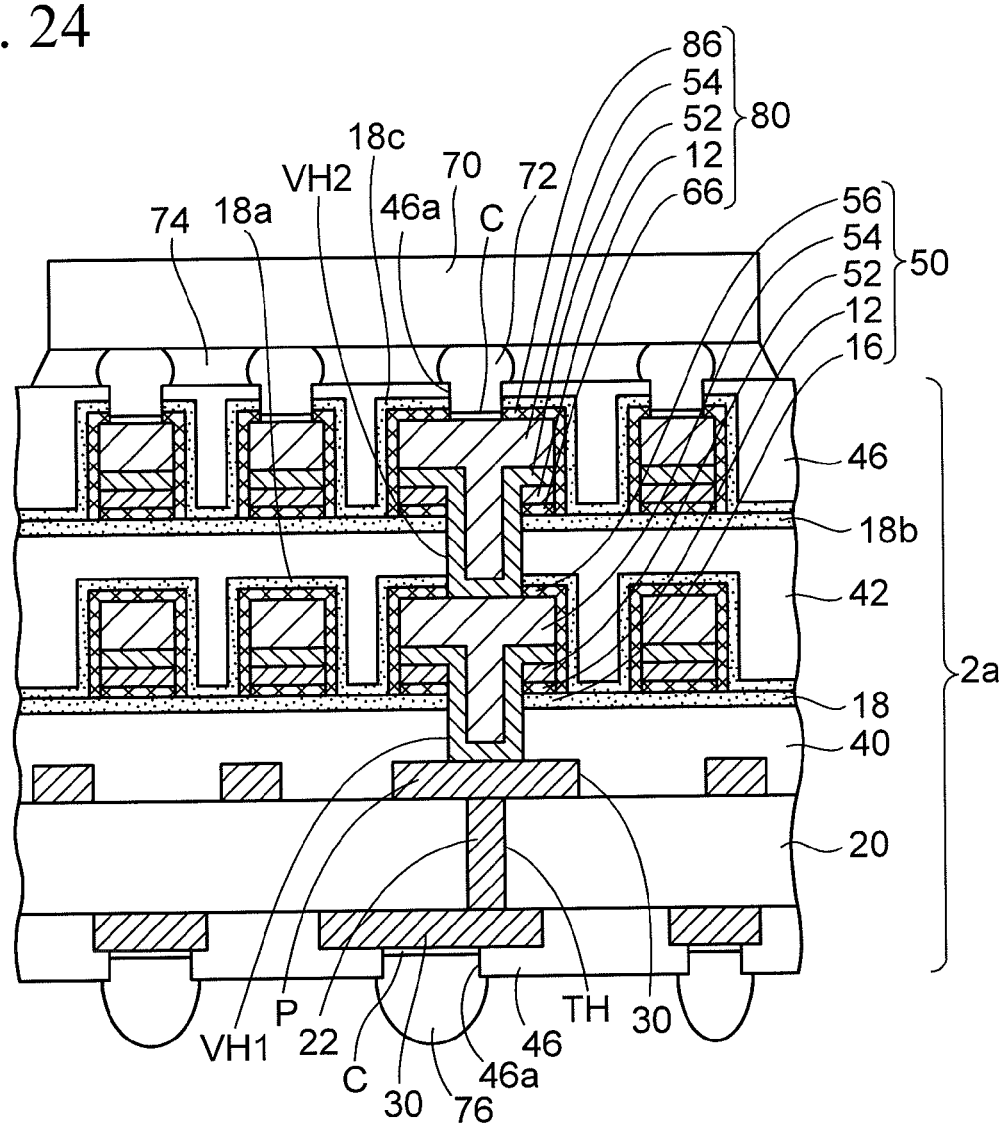
FIG. 24 is a sectional view depicting a state that a semiconductor chip is mounted on the wiring substrate in FIG. 23.

In FIG. 24, a state that a semiconductor chip is mounted on the wiring substrate 2a in FIG. 23 is depicted. In an example in FIG. 24, the semiconductor chip 70 (LSI chip) is flip-chip connected to the contact layers C of the second wiring layer 80 on the upper surface side by the bump electrodes 72 such as the solder bumps, or the like.

Then, the underfill resin 74 is filled into a clearance located under the semiconductor chip 70. Also, the external connection terminals 76 are provided by mounting the solder ball, or the like on the contact layers C of the underlayer wiring layer 30 on the lower surface side.

As described above, the fourth copper tin alloy layer 86 whose electric resistance is relatively high does not exist in the connection parts of the second wiring layer 80 as the outermost layer to which the semiconductor chip 70 is connected, and thus the structure that the contact layer C is directly connected to the metal plating layers 54 made of copper, of the second wiring layer 80 can be obtained.

As a result, the contact resistance between the semiconductor chip 70 and the second wiring layer 80 of the wiring substrate 2a can be decreased, and reliability of the electric connection between both members can be improved.

As described above, in the second embodiment, the similar advantages to those of the first embodiment can be achieved, and also a reduction of the contact resistance can be attained in the via holes and the connection parts of the outermost wiring layer, and reliability of the electric connection can be improved.

All examples and conditional language recited herein are intended for pedagogical purpose to aid the reader in understanding the invention and the concepts contributed by the inventor to furthering the art, and are to be construed as being without limitation to such specifically recited examples and conditions, or does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. A wiring substrate, comprising:
a first insulating resin layer;
a first coupling agent layer formed on the first insulating resin layer;
a first wiring layer including a first copper tin alloy layer formed on the first coupling agent layer, a copper layer formed on the first copper tin alloy layer, a seed layer formed on the copper layer, and a metal plating layer formed on the seed layer; and
an underlayer wiring layer formed under the first insulating resin layer, a via hole being formed in the first insulating resin layer to reach the underlayer wiring layer,
wherein the first coupling agent layer is formed on the first insulating resin layer except the via hole, and
wherein the seed layer is formed to extend from an inner surface of the via hole onto the copper layer, and
the first wiring layer is connected to the underlayer wiring layer via the via hole.

2. A wiring substrate according to claim 1, further comprising:
a second copper tin alloy layer formed on an upper surface and a side surface of the first wiring layer;

a second coupling agent layer covering the second copper tin alloy layer of the first wiring layer; and a second insulating resin layer formed on the second coupling agent layer.

3. A wiring substrate according to claim 2, further comprising:

a via hole formed in the second insulating resin layer, the second coupling agent layer, and the second copper tin alloy layer to reach the first wiring layer; and a second wiring layer formed on the second insulating resin layer, and connected to the first wiring layer via the via hole.

4. A wiring substrate according to claim 3, further comprising:

a third copper tin alloy layer formed on an upper surface and a side surface of the second wiring layer;

a third coupling agent layer covering the third copper tin alloy layer of the second wiring layer; and a protection insulating layer formed on the third coupling agent layer, and in which an opening portion is provided in a part corresponding to a connection part of the second wiring layer;

wherein the third coupling agent layer and the third copper tin alloy layer located in the opening portion of the protection insulating layer are removed.

* * * * *